(12) United States Patent
Sakai et al.

(10) Patent No.: US 7,145,612 B2
(45) Date of Patent: Dec. 5, 2006

(54) DISPLAY DEVICE COMPRISING PLASMA DISCHARGE SWITCHING ELEMENT WITH THREE ELECTRODES

(75) Inventors: Osamu Sakai, Nara (JP); Masaya Okamoto, Kyoto (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/481,630

(22) PCT Filed: Jun. 14, 2002

(86) PCT No.: PCT/JP02/05990

§ 371 (c)(1),
(2), (4) Date: Jun. 1, 2004

(87) PCT Pub. No.: WO03/001552

PCT Pub. Date: Jan. 3, 2003

(65) Prior Publication Data

US 2004/0218110 A1    Nov. 4, 2004

(30) Foreign Application Priority Data

Jun. 26, 2001  (JP)  ............................. 2001-192773
Mar. 6, 2002   (JP)  ............................. 2002-060412

(51) Int. Cl.
  *G02F 1/1368*  (2006.01)
  *H01J 17/49*   (2006.01)
  *G09G 3/36*    (2006.01)
(52) U.S. Cl. ..................... 349/41; 349/32; 345/62; 345/67; 313/585; 313/588
(58) Field of Classification Search ............. 349/32, 349/41; 345/62, 67
See application file for complete search history.

(56) References Cited

U.S. PATENT DOCUMENTS

| | | | | |
|---|---|---|---|---|
| 4,160,932 A | * | 7/1979 | Mikoshiba et al. | 315/169.4 |
| 4,839,637 A | * | 6/1989 | Mikoshiba et al. | 345/67 |
| 5,075,594 A | | 12/1991 | Schumacher et al. | |
| 5,561,348 A | * | 10/1996 | Schoenbach et al. | 315/169.1 |
| 6,310,665 B1 | * | 10/2001 | Kido | 349/32 |

FOREIGN PATENT DOCUMENTS

| | | |
|---|---|---|
| JP | 53-037379 | 4/1978 |
| JP | 53-040227 | 4/1978 |
| JP | 9-120270 | 5/1997 |
| JP | 9-166774 | 6/1997 |
| JP | 9-179105 | 7/1997 |
| JP | 2000-223037 | 8/2000 |
| WO | WO 96/32827 | 10/1996 |

OTHER PUBLICATIONS

Machine translation of Sakai, Japanese Patent Document No. 2000-223,037 (made of record by applicant).*

* cited by examiner

*Primary Examiner*—Andrew Schechter
(74) *Attorney, Agent, or Firm*—Keating & Bennett, LLP

(57) ABSTRACT

A switching element includes a first electrode 1 and a second electrode 2 provided apart from each other so as to run a discharge current between them, and a third electrode 3 configured to be capable of changing the difference in potential from at least one of the first and second electrodes 1 and 2, and of controlling the magnitude of the discharge current running between the first and second electrodes 1 and 2 by changing this potential difference.

24 Claims, 20 Drawing Sheets

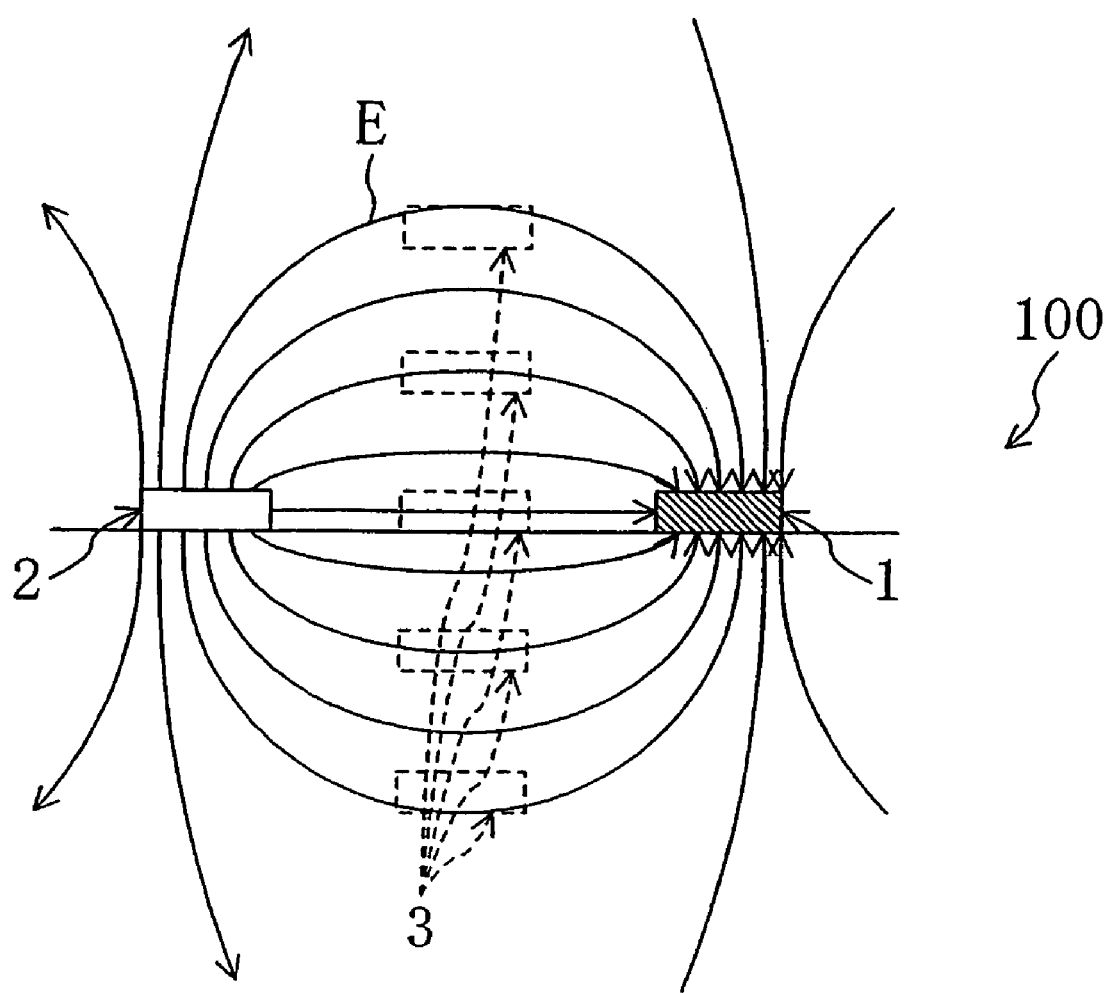

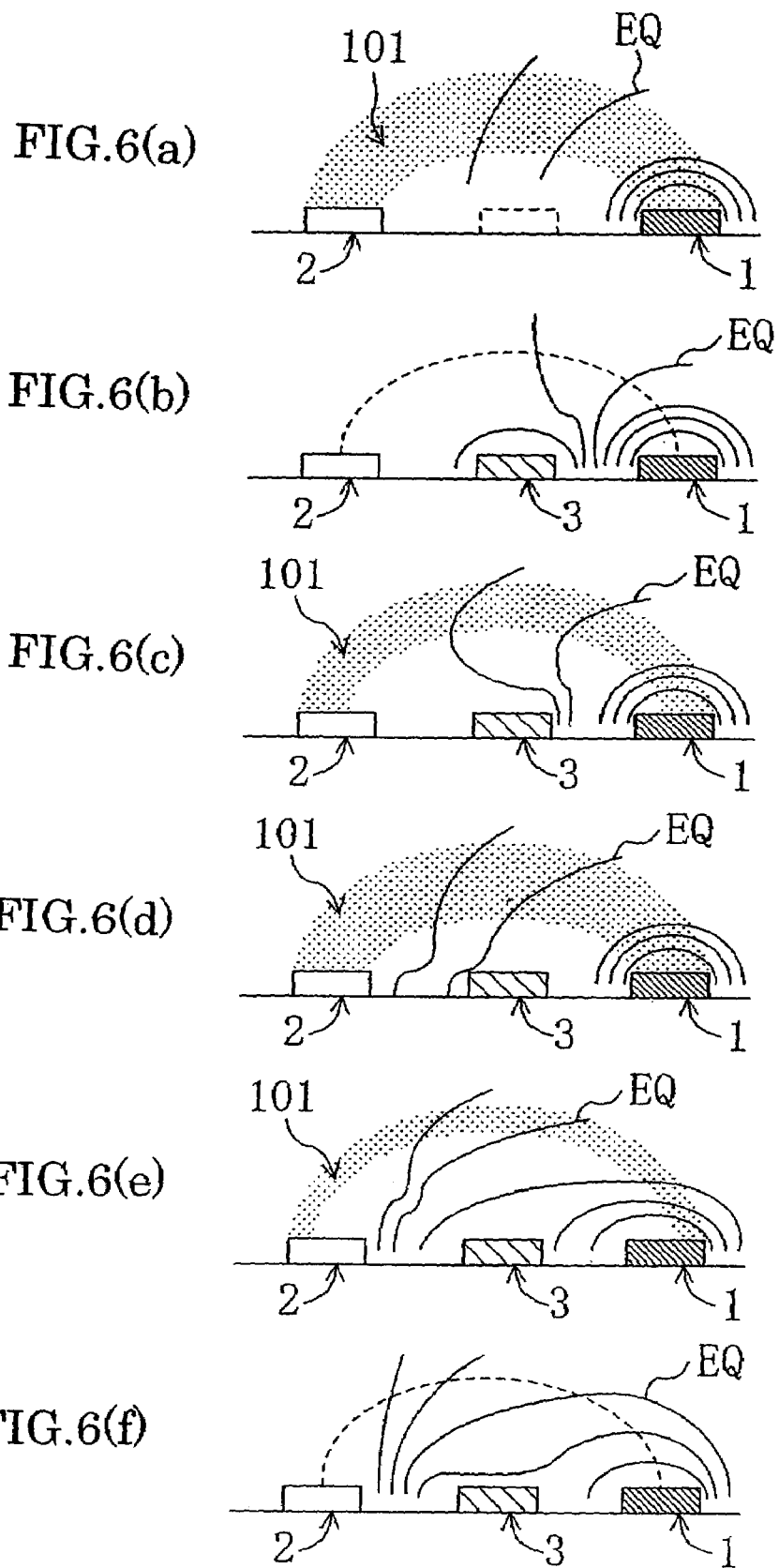

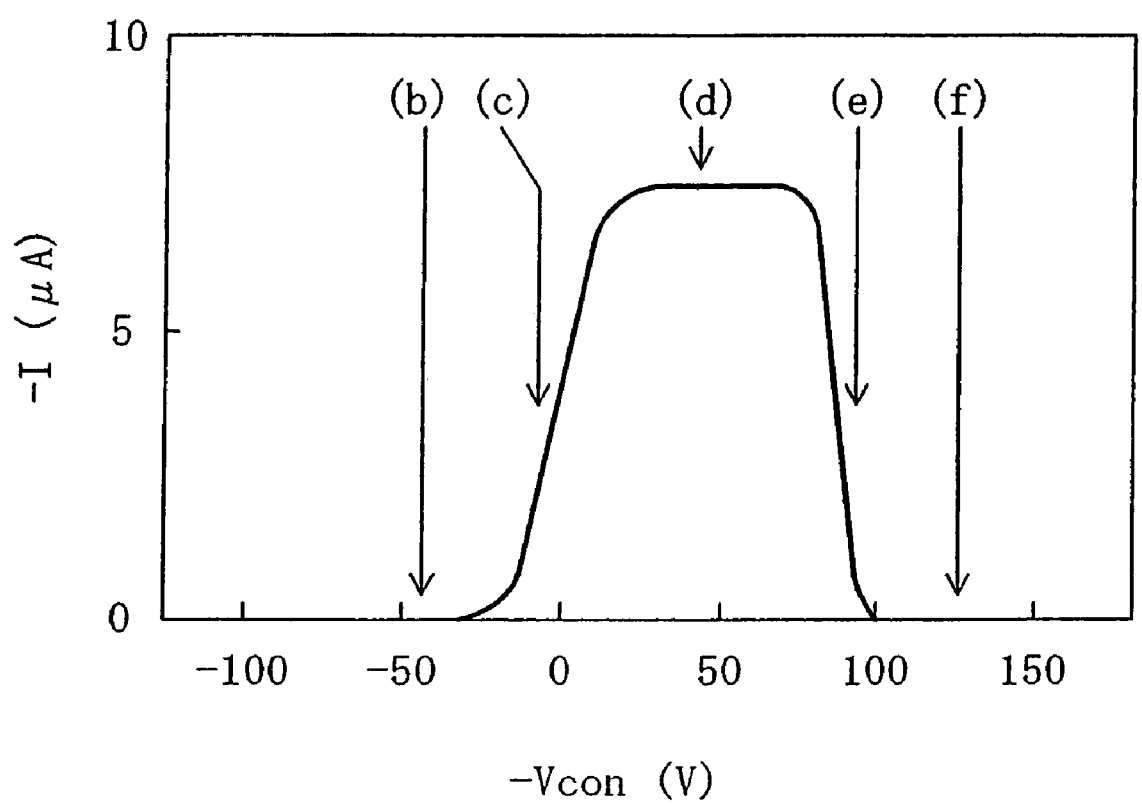

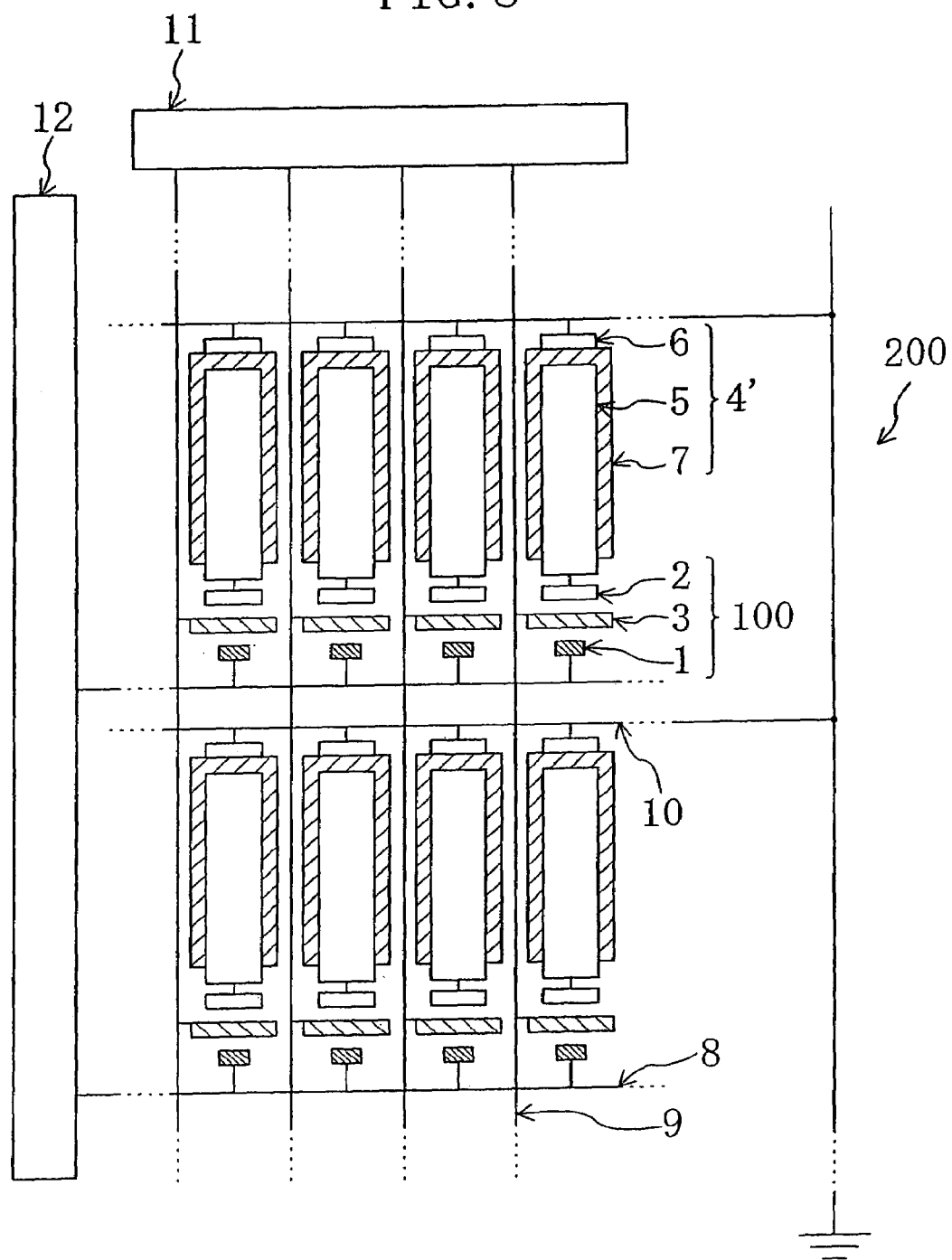

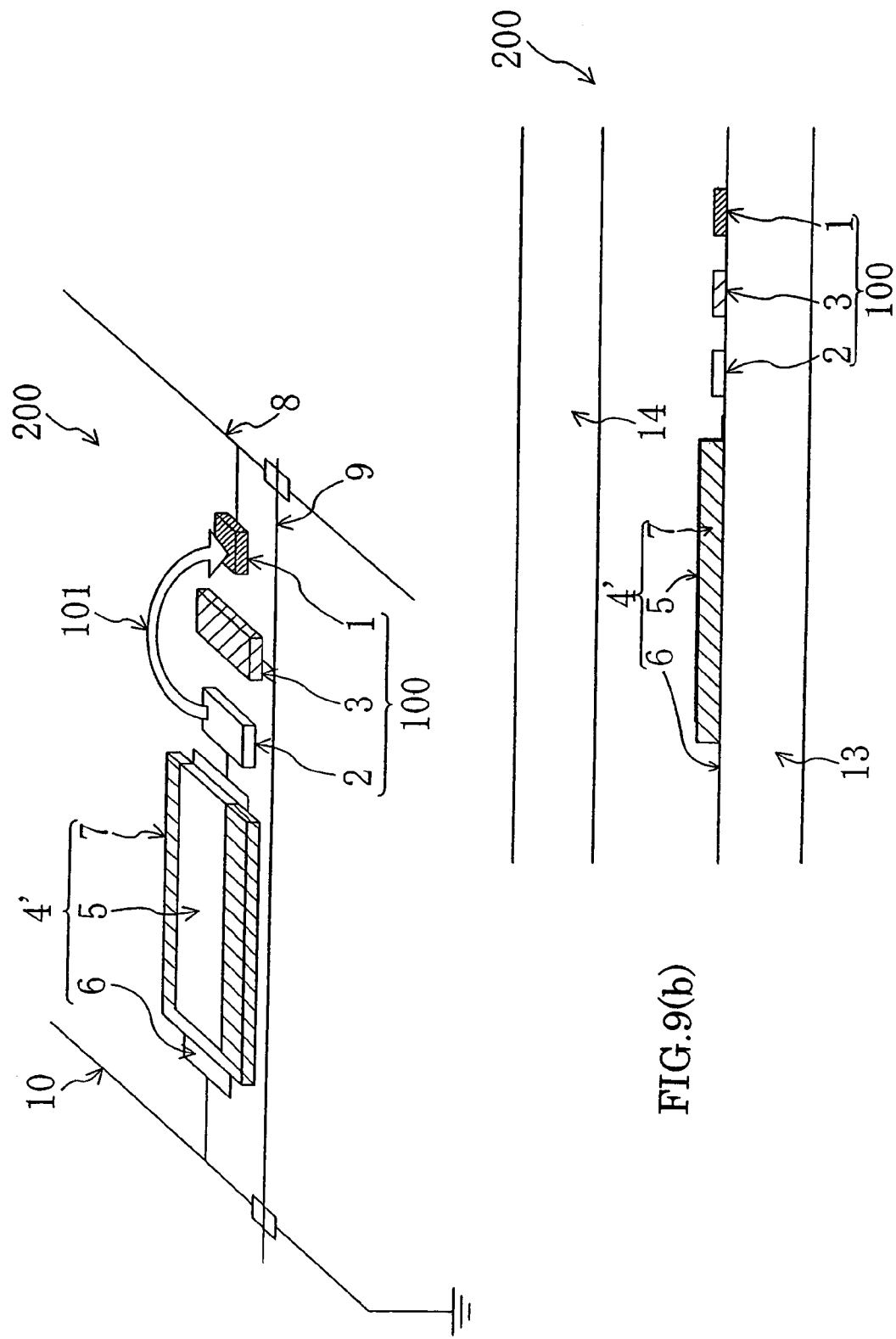

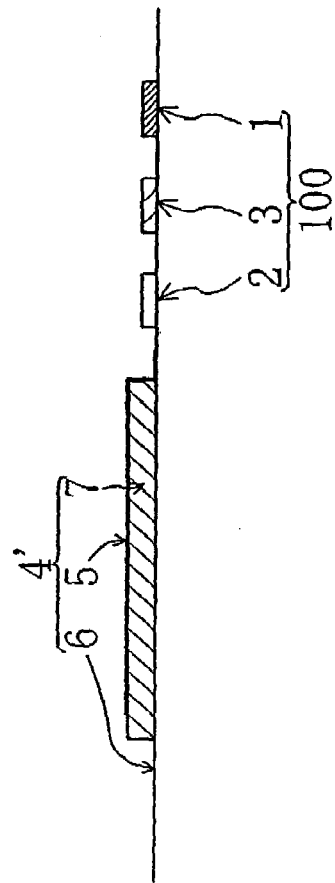
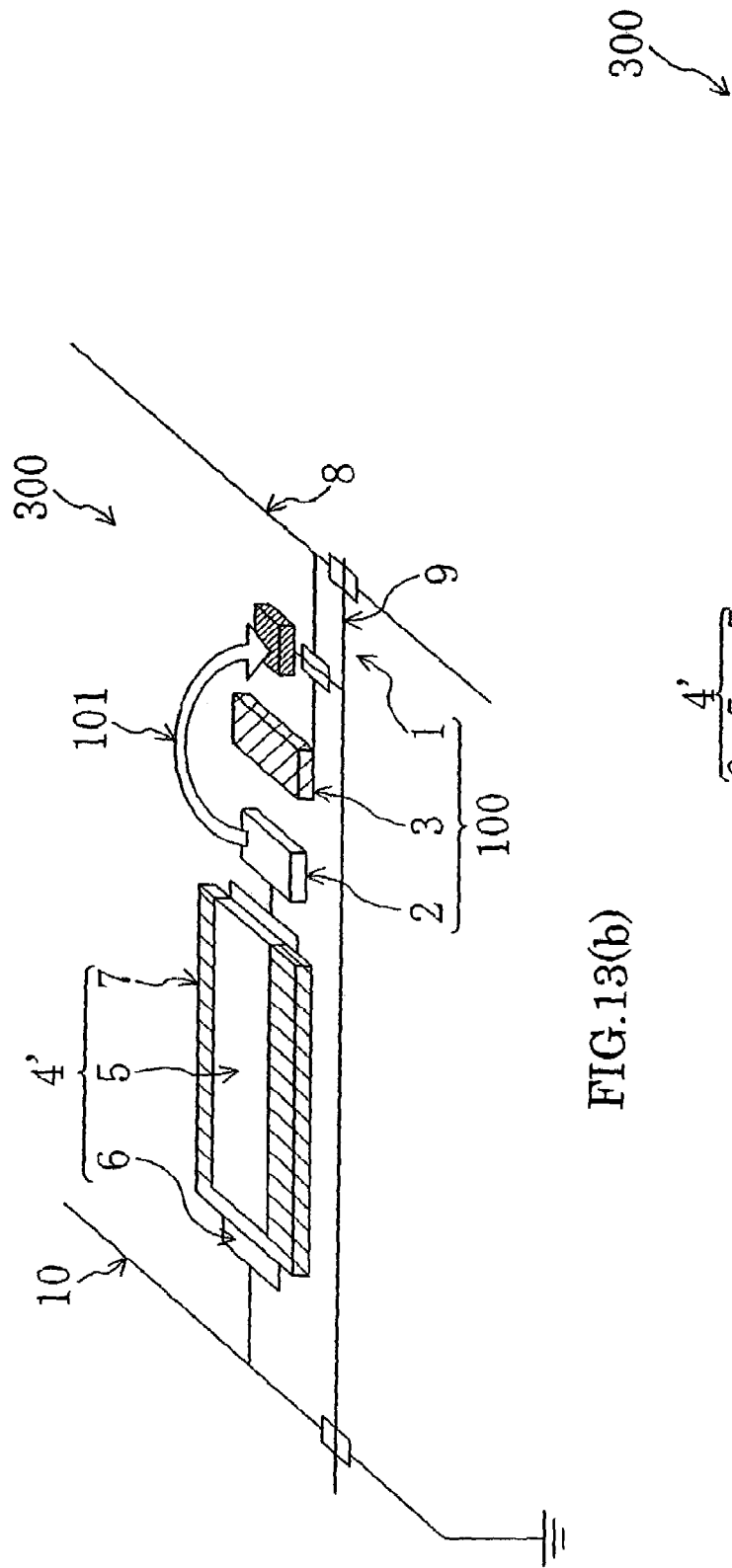

DISPLAY DEVICE COMPRISING PLASMA DISCHARGE SWITCHING ELEMENT WITH THREE ELECTRODES

BACKGROUND OF THE INVENTION

1. Field of the Invention

The present invention relates to a switching element and a display device comprising this switching element.

2. Description of the Related Art

Image display devices are now widely used as display sections of computers, televisions, and the like. Typical known examples of image display devices are cathode ray tube displays, liquid crystal displays, or organic electro luminescence displays.

In recent years, flat panel displays (FPD) such as liquid crystal displays and organic electro luminescence displays have been widely used in place of CRT displays, which were previously widely used. This is because the FPD is lighter and thinner and is thus portable and saves space.

As basic parts of the FPD, thin-film transistors (TFT) have been widely used as switching elements that accomplish active matrix driving. Furthermore, TFT substrates have been widely used The TFT substrate includes a large number of fine TFTs arranged on a substrate. Typically, the TFTs arranged in a matrix each include a gate electrode, a source electrode, and a drain electrode. By supplying a gate signal and an address signal to the gate electrode and the source electrode, respectively, the TFTs are sequentially scanned to accurately represent two-dimensional information on an image.

The TFT substrate is manufactured by depositing and patterning a semiconductor film, an insulating film, or a conductor film on an insulating substrate using a vacuum apparatus such as a plasma induced chemical deposition apparatus, a sputtering apparatus, or a dry etching apparatus. The TFT substrate is expensive because it is manufactured through such a large number of complicated manufacturing steps. In particular, a large vacuum apparatus is required to produce large substrates. However, the above vacuum apparatuses are expensive, and in particular larger vacuum apparatuses are very expensive. This further increases manufacturing costs.

In this case, the large substrate refers mainly to a substrate of 20 inches or more diagonal. A display including such a large substrate is called a large display. In recent years, larger FPDs have been desired to be developed in order to provide large (20 inches or more diagonal) and thin televisions.

Instead of TFT substrates which are expensive and are difficult to make larger, Buzaku et. al proposes in Japanese Patent Laid-Open No. 9-120270 an address device utilizing a discharge plasma switch.

With reference to FIG. 20, a brief description will be given of the address device 700 disclosed in Japanese Patent Laid-Open No. 9-120270. FIG. 20 is a perspective view schematically showing the address device 700. In FIG. 20, reference numeral 701 schematically shows that discharge is occurring. The address device 700 has a first substrate and a second substrate (neither of them are shown) and a dielectric layer 44 provided between the first and second substrates.

The second substrate has a plurality of parallel stripes-like grooves. Each of the grooves and the dielectric layer 44 define a sealed plasma channel (discharge channel). A gas that can be ionized by discharge is sealed in the plasma channel. A pair of discharging electrodes 41 and 42 is provided at the bottom of the groove. One of the electrodes constituting the pair is used as an anode (A), while the other is used as a cathode (K). A voltage is applied to the gas sealed in the plasma channel to ionize the gas to generate discharge plasma. The term "activate" or "activation" may be used to express the operation of generating plasma discharge to ionize the gas present in the plasma channel.

On the other hand, a plurality of parallel stripes-like transparent electrodes 49 are provided on a surface of the first substrate which is opposite to the dielectric layer 44. The stripes-like transparent electrodes 49 are arranged to cross the stripes-like grooves (i.e. the plasma channels) formed in the second substrate. The crossing portions define individual address areas arranged in a matrix.

In this address device, for example, the plasma channels constitute row scanning units, whereas the transparent electrodes 49 constitute column driving units. Selective plasma discharge is used to sequentially activate the plasma channels to execute line sequential scanning for each raw. In synchronization with this, a driving signal is applied to each of the transparent electrodes 49, constituting the column driving units. When plasma discharge is used to activate the plasma channel, an anode potential level is almost uniformly established in the plasma channel. Then, one end of the dielectric layer 44 in each address area is connected to the anode electrode via a surface 44' of the dielectric layer. In this manner, the plasma channel constitutes what is called a plasma switch. When the switch is turned on, a driving signal is synchronously applied to the other end of the dielectric layer 44 in each address area. Charges equivalent to a difference in potential are accumulated in the dielectric layer 44. The applied driving signal is held even after the plasma switch has been turned off. That is, what is called "sample and hold" is carried out.

Compared to TFT substrates, it is easy to increase the size of the address device 700, which utilizes the discharge plasma switches as described above, and the manufacturing costs of this device are low. However, the address device 700 creates the problems described below.

With the address device 700, a switching operation is performed utilizing the characteristic that the activation of each plasma channel based on plasma discharge causes the anode potential level to be almost uniformly established in the plasma channel, as described above. However, actually, a sheath voltage attributed to plasma is present, so that the potential on the surface 44' of the dielectric layer is not the same as the anode potential.

Thus, a voltage equivalent to the difference between the potential on the surface 44' of the dielectric layer and the anode potential must be applied, as a bias, to the voltage of the driving signal applied to the transparent electrodes 49. This bias voltage varies depending on the shapes of the discharge electrodes 41 and 42 and plasma channels. Accordingly, the bias voltage must be set for each address device. Furthermore, if the shapes of the discharge electrodes 41 and 42 and plasma channels vary significantly with areas within the single address device, the bias voltage must be varied depending on the areas within the single address device.

In the address device 700, data is written and accumulated by accumulating charges on the surface 44' of the dielectric layer. However, plasma generated in each plasma channel is nonuniformly distributed around the discharging electrodes 41 and 42. Accordingly, charge accumulated on the surface 44' of the dielectric layer is also nonuniformly distributed. Thus, data (that is, charge) accumulated in each address area are nonuniform within the address area. Consequently, if the address device 700 is used as a display device, display will be nonuniform in a pixel area corresponding to each address area.

Moreover, in the address device 700, data are written and accumulated using charged particles of plasma generated in each plasma channel. However, depending on the type or pressure of a discharge gas sealed in the plasma channel, charged particles may remain in the plasma channel for a relatively long time even after the anode potential has become 0 V. The remaining charged particles may affect the write or accumulation of data.

The time for which charged particles remain depends on the type of the discharge gas and the sealing pressure. Accordingly, the type of the discharge gas and the sealing pressure must be optimized in order to increase switching speed. If the optimization is not carried out, the achieved switching speed will be low. Even if such a discharge gas as achieves a high switching speed is used, problems such as an increased discharge voltage may occur.

The present invention is provided in view of these problems. It is an object of the present invention to provide a switching element that can be easily manufactured and a display device comprising this switching element.

SUMMARY OF THE INVENTION

A switching element according to the present invention includes a first electrode and a second electrode provided apart from each other so as to run a discharge current between them, and a third electrode configured to be capable of changing the difference in potential from at least one of the first and second electrodes, and of controlling the magnitude of the discharge current running between the first and second electrodes by changing the potential difference. This arrangement accomplishes the above object.

Alternatively, a switching element according to the present invention includes a first electrode and a second electrode that generate discharge between them and a third electrode that controls the discharge occurring between the first electrode and the second electrode. This arrangement accomplishes the above object.

Preferably, the magnitude of a discharge current flowing from one of the first and second electrodes to the other is controlled in accordance with a potential of the third electrode.

Preferably, a discharge gas is provided between the first electrode and the second electrode and between one of the first and second electrodes and the third electrode, and the pressure of the discharge gas is set so that a starting voltage of discharge between the above mentioned one of the first and second electrodes and the third voltage is higher than that between the first electrode and the second electrode.

Alternatively, a switching element according to the present invention includes a first electrode and a second electrode provided apart from each other so as to run a discharge current between them, and a third electrode configured to be capable of changing the difference in potential from at least one of the first and second electrodes, and of controlling the magnitude of the discharge current running between the first and second electrodes by changing the potential difference. A discharge gas is provided between the first electrode and the second electrode and between one of the first and second electrodes and the third electrode. The pressure of the discharge gas is set so that a starting voltage of discharge between the above mentioned one of the first and second electrodes and the third voltage is higher than that between the first electrode and the second electrode. This arrangement accomplishes the above object.

Alternatively, a switching element according to the present invention includes a first electrode and a second electrode provided apart from each other so as to run a discharge current between them, and a third electrode configured to be capable of changing the difference in potential from at least one of the first and second electrodes. A discharge gas is provided between the first electrode and the second electrode and between one of the first and second electrodes and the third electrode. The third electrode is configured to vary a distribution of equipotential surfaces attributed to discharge occurring between the first electrode and the second electrode. This arrangement accomplishes the above object.

The pressure of the discharge gas is preferably set so that a starting voltage of discharge between the above mentioned one of the first and second electrodes and the third voltage is higher than that between the first electrode and the second electrode.

The third electrode is preferably provided between the first electrode and the second electrode.

The third electrode may be provided so as not to lie between the first electrode and the second electrode.

The first, second, and third electrodes are preferably provided on the same plane.

The third electrode may be provided so as to lie on a plane different from one on which the first and second electrodes are located.

The first and second electrodes may be provided opposite each other, and the third electrode may be provided between the first electrode and the second electrode.

The switching element may further include a plurality of wires including a wire electrically connected to one of the first and second electrodes and a wire electrically connected to the third electrode. At least one of the plurality of wires may be arranged so as not to be parallel with a plane defined by the first, second, and third electrodes.

A display device according to the present invention includes a plurality of pixels arranged in a matrix, the switching element provided in each of the plurality of pixels and configured as described above, a scanning line electrically connected to one of the first and second electrodes of the switching element, a signal line electrically connected to the third electrode of the switching element, a pixel electrode electrically connected to the other of the first and second electrodes of the switching element, a counter electrode opposed to the pixel electrode, and a display medium layer provided between the pixel electrode and the counter electrode. This arrangement accomplishes the above object.

An another display device according to the present invention includes a plurality of pixels arranged in a matrix, the switching element provided in each of the plurality of pixels and configured as described above, a scanning line electrically connected to the third electrode of the switching element, a signal line electrically connected to one of the first and second electrodes of the switching element, a pixel electrode electrically connected to the other of the first and second electrodes of the switching element, a counter electrode opposed to the pixel electrode, and a display medium layer provided between the pixel electrode and the counter electrode. This arrangement accomplishes the above object.

The display medium layer may be configured as a liquid crystal layer.

The display medium layer may be configured as an organic electro luminescence material layer.

BRIEF DESCRIPTION OF THE DRAWINGS

FIG. 4 is a diagram showing an example in which the third electrode 3 in the switching element 100 of Embodiment 1 according to the present invention is arranged;

FIGS. 6(a) to 6(f) are diagrams schematically showing a potential profile (the distribution of equipotential surfaces) present in a discharge space;

FIG. 7 is a graph showing the element characteristics of the switching element 100;

FIG. 8 is a plan view schematically showing a display device 200 of Embodiment 2 according to the present invention;

FIG. 9(a) is a perspective view schematically showing an area corresponding to one pixel in the display device 200 of Embodiment 2 according to the present invention, and FIG. 9(b) is a sectional view schematically showing an area corresponding to one pixel in the display device 200 of Embodiment 2 according to the present invention;

FIG. 13(a) is a perspective view schematically showing an area corresponding to one pixel in a display device 300 of Embodiment 3 according to the present invention, and FIG. 13(b) is a sectional view schematically showing an area corresponding to one pixel in the display device 300 of Embodiment 3 according to the present invention;

DETAILED DESCRIPTION OF PREFERRED EMBODIMENTS

Figure 1A:
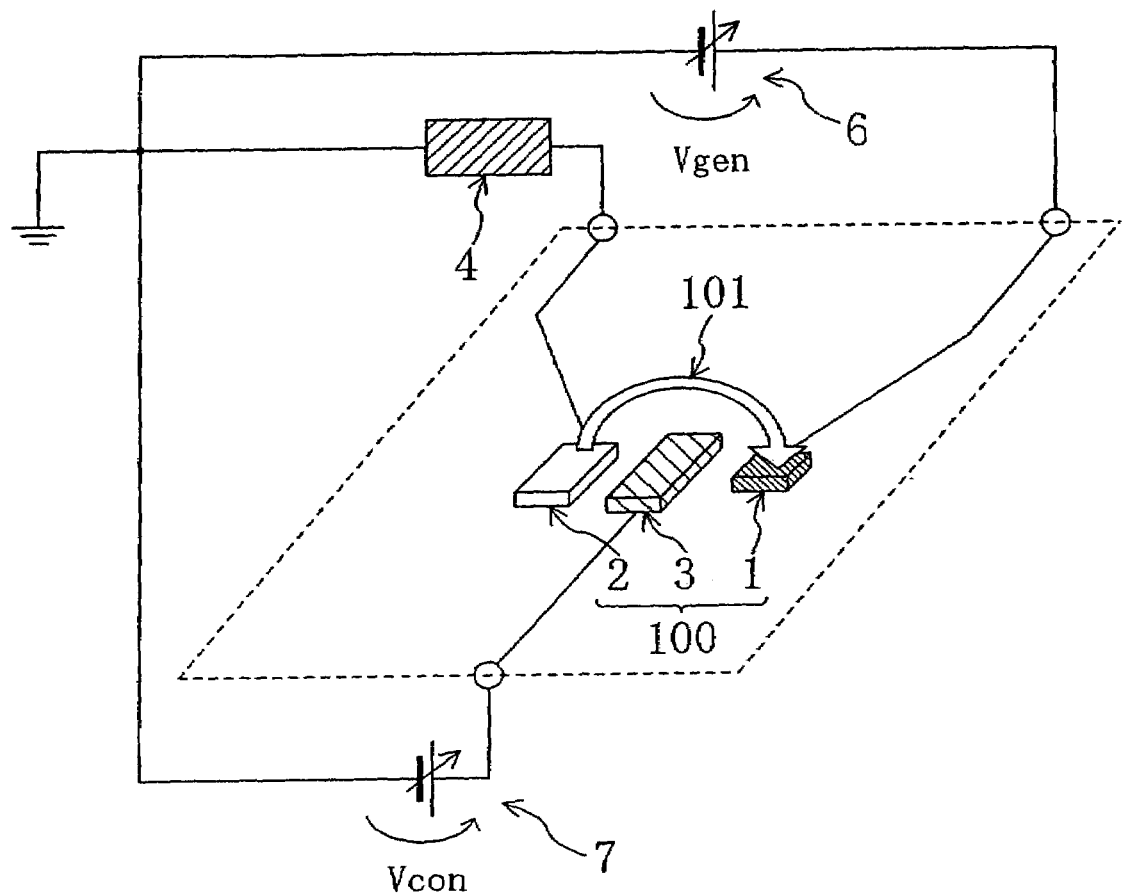
FIG. 1(a) is a perspective view schematically showing a switching element 100 of Embodiment 1 according to the present invention.

First, description will be given of the basic configuration, operations, and effects of a switching element according to the present invention.

The switching element according to the present invention includes a first electrode and a second electrode which cause discharge between them, and a third electrode that controls the discharge between the first electrode and the second electrode.

When a predetermined potential difference is provided between the first electrode and the second electrode, discharge occurs between these electrodes to run a discharge current between them. Since the discharge is controlled by the third electrode, it is possible to switch between a state in which the first and second electrodes are electrically conductive (a discharge current flows between these electrodes) and a state in which the first and second electrodes are not electrically conductive (no discharge currents flow between these electrodes). Typically, the magnitude of the discharge current is controlled in accordance with the potential of the third electrode.

One of the first and second electrodes is electrically connected to a switched section. The switching element according to the present invention functions to control the supply of charges or currents to the switched section.

The switching element according to the present invention is configured as described above. Accordingly, the first, second, and third electrodes need not be formed using separate processes. This simplifies the manufacture of the switching element. Furthermore, as described above, a switching operation is performed by controlling discharge. Consequently, no off currents are generated in contrast with thin film transistors (TFTs). Furthermore, the constitution in which the first, second, and third electrodes do not overlap one another via insulating films can be adopted. This prevents delays or disturbances in electric signals caused by a capacitance formed in an overlapping portion. It is thus possible to easily increase the size of an address device or display device comprising the switching element.

The "discharge" described above is a dielectric breakdown phenomenon that occurs in a space filled with a gas generated by applying a voltage to between the electrodes. After the discharge have occurred, a plasma state (discharge state) in which positive ions and electrons are present in almost equal amounts appears in this space. For the "discharge current", positive ions having positive charges and electrons having negative charges act as carriers.

The discharge phenomenon (plasma phenomenon) will be described below in detail.

A phenomenon occurs in which the electric field value (the value of the electric field value/gas pressure is normally used) of a space filled with gas increases to accelerate electrons present in the space to cause them to impact gas atoms (molecules), thus generating positive ions and electrons. A phenomenon also occurs in which positive ions present in the space impact a negative potential-side electrode (cathode) surface to generate secondary electrons. These phenomena are combined to generate positive ions and electrons. These particles are migrated in the opposite directions by electric fields present in the space. The forms of migration of particles (migration of carriers for a current) include not only such a drift phenomenon caused by electric fields but also a diffusion phenomenon attributed to the nonuniform distribution of particles.

The flow of a discharge current as described above is a mechanism different from a vacuum tube or a field emission display (FED). In the vacuum tube, electrons emitted from a heated filament act as carriers for a current. In the FED, electrons drawn out of a sharp cathode utilizing field emission act as carriers for a current.

The discharge (plasma) differs from the vacuum tube or FED in other points. An example of such a difference is the distribution of electric lines of force or equipotential surfaces present in the space through which a current flows. In the vacuum tube or FED, electric lines of force must be present almost like straight lines between a cathode and an anode (positive potential-side electrode) except in the vicinity of an electrode used to draw out the flow of electrons. Electrons migrate along such electric lines of force. Accordingly, the cathode and the anode must basically be provided opposite each other. Equipotential surfaces are present substantially at equal intervals in the space between the cathode and the anode.

In contrast, in the case of the discharge (plasma), electric lines of force join the cathode with the anode but need not be shaped like straight lines. They may be shaped like arches (see FIG. 1, described later). Furthermore, a large number of equipotential surfaces are biasedly present near the cathode. That is, the intervals between the equipotential surfaces are small near the cathode. In this part, a potential gradient is steep and electric fields are intense. This corresponds to a distribution characteristic of the discharge.

In the case of the discharge (plasma), a unique potential profile such as the one described above is formed. In other words, the discharge does not occur unless such a potential profile is maintained. Utilizing these characteristics of the discharge phenomenon, it is possible to control the discharge by externally applying a disturbance potential. In the vacuum tube or FED, a current remains flowing even with a small change in the potential profile between the electrodes.

Furthermore, in the discharge (plasma) state, positive ions having positive charges and electrons having negative charges are present in equal amounts. Accordingly, from a macro viewpoint, the discharge state is an electrically neutral state. That is, an electrically stable state is realized. In contrast, in the vacuum tube or FED, only electrons are present, so that the negative charges of electrons repel each other to expand the flow of electros unless the flow is properly controlled. Specifically, in the vacuum tube or FED, the flow of electrons is an electrically unstable state. Thus, to obtain a sufficient current, electrons must be accelerated at a high voltage.

Embodiments of the present invention will be described below with reference to the drawings. The present invention is not limited to the embodiments below.

(Embodiment 1)

Figure 1B:
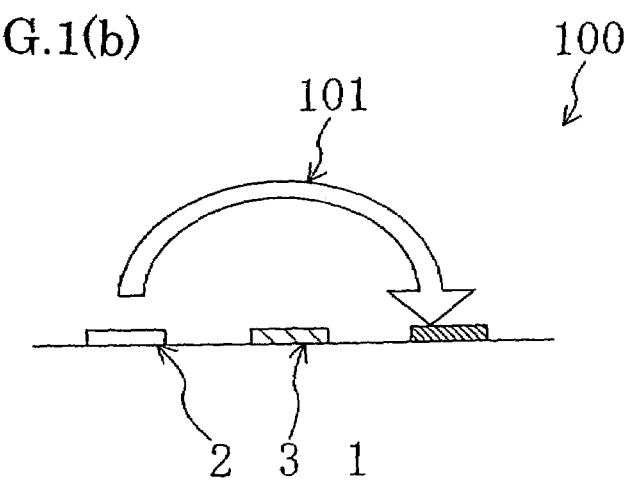
FIG. 1(b) is a sectional view schematically showing the switching element 100 of Embodiment 1 according to the present invention.

First, with reference to FIGS. 1(a) and 1(b), description will be given of a switching element 100 of Embodiment 1 according to the present invention. FIG. 1(a) is a perspective view schematically showing the switching element 100. FIG. 1(b) is a sectional view schematically showing the switching element 100.

The switching element 100 includes a first electrode (first discharging electrode) 1 and a second electrode (second discharging electrode) 2 which generate discharge between them, and a third electrode (discharge control electrode) 3 that controls the discharge between the first electrode and the second electrode. In FIGS. 1(a) and 1(b), reference numeral 101 schematically shows that discharge is occurring between the first electrode 1 and the second electrode 2.

The first and second electrodes 1 and 2 are spaced from each other so as to run a discharge current between them. The third electrode 3 is provided between the first electrode 1 and the second electrode 2. In the present embodiment, the first, second, and third electrodes 1, 2, and 3 are formed on a substrate (not shown in the drawings) having an insulating surface.

The switching element 100 further includes discharge gas (not shown in the drawings) between the first electrode 1 and the second electrode 2. The discharge gas is sealed inside a gas sealing structure (not shown in the drawings) formed on the substrate.

The switching element 100 configured as described above is manufactured, for example, in the following manner.

First, the first, second, and third electrodes 1, 2, and 3 are formed on the substrate. In this case, the substrate is a glass substrate composed of soda glass of thickness 3 mm. Of course, the material and thickness of the substrate are not limited to the above ones. The substrate has only to withstand a process of manufacturing the switching element 100. A transparent substrate may be used depending on the application of the switching element 100. For example, if the switching element is used in a transmission liquid crystal display device or a transmission/reflection combination-type liquid crystal display device which uses light from a backlight for display, a transparent substrate is used. If it is used in a reflection liquid crystal display device or an organic EL display device, an opaque substrate composed of a material such as metal or resin may be used.

In this case, nickel is used as a material for the electrodes. A screen printing method is used to form the first, second, and third electrodes 1, 2, and 3. First, a nickel paste containing nickel powders and a binder material is applied to the substrate by being passed through a mesh portion of a screen printing plate having a predetermined pattern. Then, the nickel paste applied to the substrate is dried and solidified at about 300° C. Subsequently, the nickel paste is fired at about 600° C. to make it conductive. In the present embodiment, the first, second, and third electrodes 1, 2, and 3 are formed in this order along a lateral direction at intervals of about 40 μm. The sizes of the electrodes are shown below.

First electrode 1: about 50 μm×about 50 μm; thickness: about 15 μm

Second electrode 2: about 80 μm×about 50 μm; thickness: about 15 μm

Third electrode 3: about 100 μm×about 50 μm; thickness: about 15 μm

The material for these electrodes is not limited to nickel. It is possible to use metal that is conductive and has an appropriate secondary electron emission coefficient. Silver or aluminum may be used. Furthermore, the method of forming the electrodes is not limited to the screen printing method. A sand blast method or a photosensitive paste method may be used to form a thick film of thickness 1 μm or more. Alternatively, a sputtering method or an electron beam deposition method may be used to form a thin film of thickness 1 μm or less, and a dry or wet etching process maybe executed to form a predetermined electrode pattern (shape). When the screen printing method is used as in the case of the present embodiment, the electrodes can be easily formed. The size of the device can thus easily increased to allow a large number of switching elements to be formed on the substrate.

Alternatively, it is allowable to form, on the surfaces of the electrodes formed as described above, a film composed of a material such as a lanthanum hexaboride, gadolinium hexaboride, or magnesium oxide which has a large secondary electron emission coefficient and a high sputter resistance. Such a film can be formed using, for example, an electrode position method, the sputtering method, or the electron beam deposition method.

Then, a gas sealing structure is formed on the substrate on which the electrodes have been formed as described above. First, a frit material mainly composed of glass is applied to the substrate so as to surround the first, second, and third substrate 1, 2, and 3. Subsequently, a spacer defining the height of a gas sealing structure (height: about 300 μm) and a glass plate are arranged in position and then fired at about 600° C. to form a gas sealing structure in which the substrate on which the electrodes have been formed and the glass plate are glued to each other using the frit material. Subsequently, the gas sealing structure is evacuated, and helium as a discharge gas is sealed in the structure at a pressure of about 300 Torr (about 40 kPa). If a plurality of switching elements are formed on the substrate, the gas sealing structure may be formed so as to surround theses switching elements. The discharge gas is not limited to helium but may be any gas that does not corrode the electrodes or adhere to them. Discharge can be induced with a relatively low voltage by using a rare gas such as helium, argon, neon, or xenon, or their mixture.

Description will be given below of the characteristics and operational principle of the switching element 100 of the present embodiment formed as described above.

If a switched section 4 is driven using the switching element 100, then for example, as shown in FIG. 1, the first electrode 1 is electrically connected to a power source 6 that supplies a discharging voltage Vgen. The third electrode 3 is electrically connected to a power source 7 that supplies a discharge control voltage Vcon. The second electrode 2 is electrically connected to the switched section 4. If the switched section 4 is equivalently a capacitance, e.g. a liquid crystal capacitance formed by a pair of electrodes (a pixel electrode and a counter electrode) and a liquid crystal layer sandwiched between these electrodes, then charges are accumulated in the switched section 4 when the switching element 100 is turned on. On the other hand, if the switched section 4 is equivalently a resistor, e.g. an organic EL (Electro Luminescence) element, a current flows through the switched section 4 when the switching element 100 is turned on.

Figure 2A:
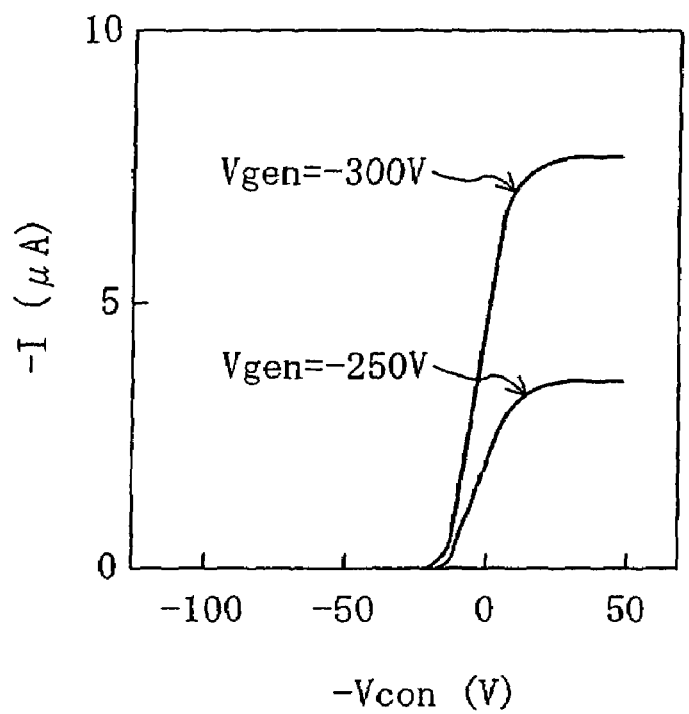
FIGS. 2(a) and 2(b) are graphs showing a variation in current I supplied to a switched section 4 of the switching element 100 of Embodiment 1 when one of a discharging voltage Vgen applied to a first electrode 1 and a discharge control voltage Vcon applied to a third electrode 3 is fixed with the other varied.
Figure 2B:
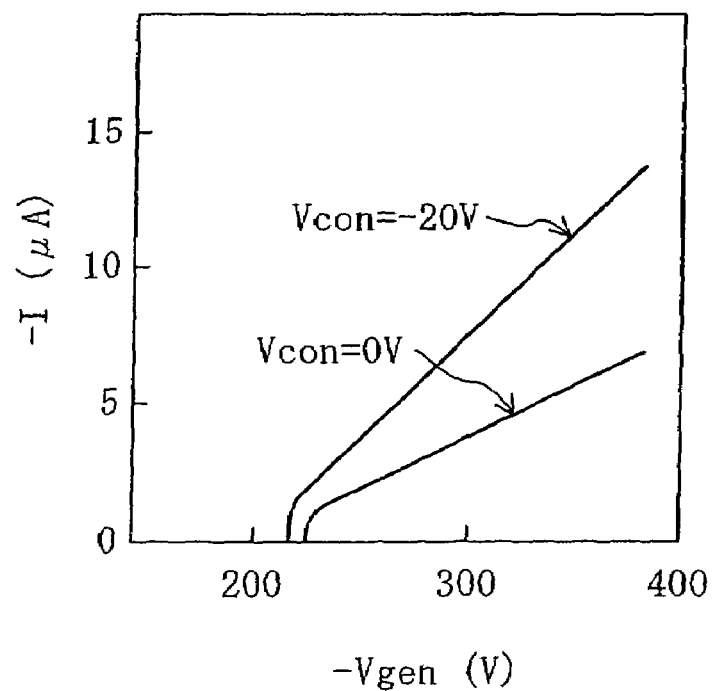

The characteristics of the switching element 100 of the present embodiment will be described with reference to FIGS. 2(*a*) and 2(*b*). FIGS. 2(*a*) and 2(*b*) are graphs showing a variation in current I supplied to the switched section 4 when one of the discharging voltage Vgen applied to the first electrode 1 and the discharge control voltage Vcon applied to the third electrode 3 is fixed with the other varied. In this case, the characteristics of the switching element 100 are measured by short-circuiting the switched section 4. In FIGS. 2(*a*) and 2(*b*), the axis of ordinate and the axis of abscissa indicate the discharging voltage Vgen, discharge control voltage Vcon, and current I as well as the same voltages and current with their polarity reversed −Vgen, −Vcon, and −I.

As shown in FIG. 2(*a*), the discharging voltage Vgen applied to the first electrode 1 is fixed (Vgen=−250 V or −300 V), while the discharge control voltage Vcon applied to the third electrode 3 is varied. Then, the magnitude of the current I supplied to the switched section 4 varies from zero to a predetermined value.

On the other hand, as shown in FIG. 2(*b*), the discharge control voltage Vcon applied to the third electrode 3 is fixed (Vcon=0 V or −20 V), while the discharging voltage Vgen applied to the first electrode 1 is varied. Then, the magnitude of the current I supplied to the switched section 4 varies from zero to a predetermined value.

Figure 3A:
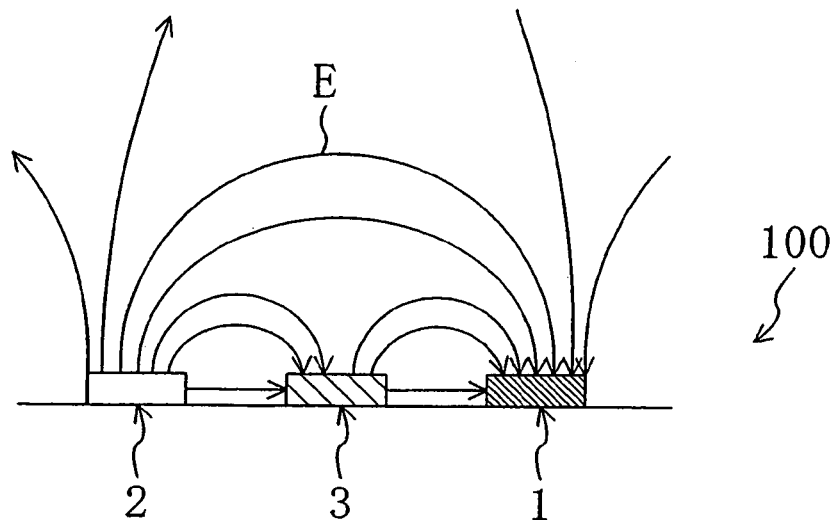
FIGS. 3(a), 3(b), and 3(c) are diagrams schematically showing electric lines of force (electric fields) E generated in accordance with the potential difference between the electrodes in the switching element 100 of Embodiment 1 according to the present invention.
Figure 3B:
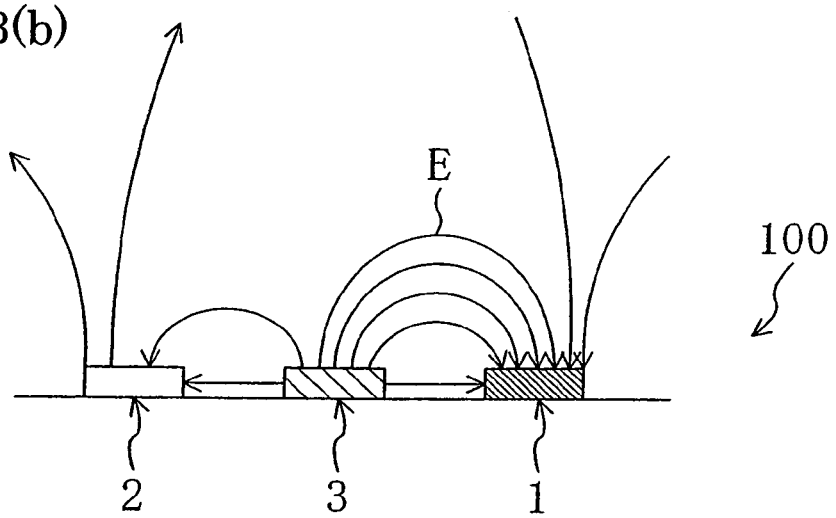
Figure 3C:
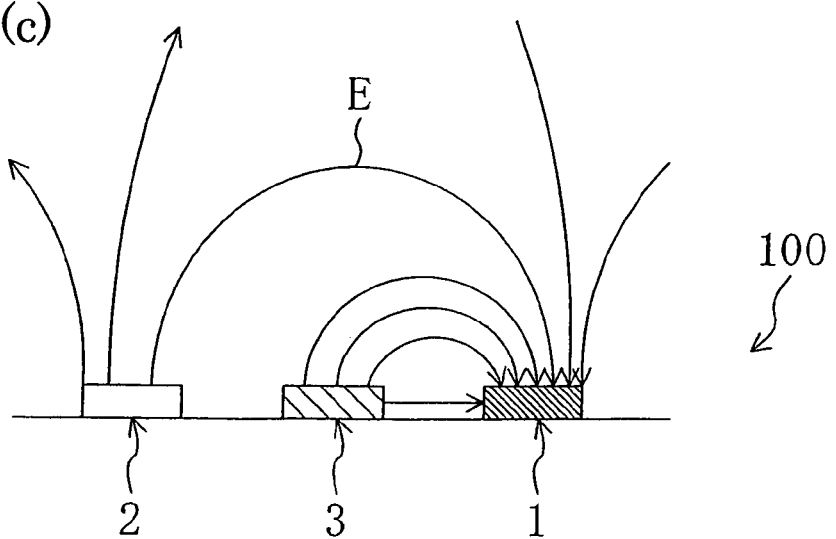

In this manner, the switching element 100 according to the present invention can control the magnitude of the current I supplied to the switched section 4. This is because the magnitude of a discharge current flowing between the first electrode 1 and the second electrode 2 varies depending on the relationship between the relative magnitudes of the potentials of the first, second, and third electrodes 1, 2, and 3. A detailed description will be given below with reference to FIGS. 3(*a*) to 3(*c*). FIGS. 3(*a*), 3(*b*), and 3(*c*) are diagrams schematically showing electric lines of force (electric fields) E generated in accordance with the difference in potential between the electrodes.

First, when the potential V3 of the third electrode 3 is between the potential V1 at the first electrode 1 and the potential V2 of the second electrode 2 and is sufficiently lower than the potential V2 of the second electrode 2 (V2>V3>V1), the electric lines of force E are principally present between the first electrode 1 and the second electrode 2 as shown in FIG. 3(*a*). Consequently, when voltages are applied to the respective electrodes so as to establish these potential levels, discharge occurs between the first electrode 1 and the second electrode 2 to run a discharge current between them.

On the other hand, when the potential V3 of the third electrode 3 is not between the potential V1 of the first electrode 1 and the potential V2 of the second electrode 2 and is sufficiently higher than the potential V2 at the second electrode 2 (V3>V2>V1), the electric lines of force E are principally present between the first electrode 1 and the third electrode 3 and not between the first electrode 1 and the second electrode 2, as shown in FIG. 3(*b*). Consequently, when voltages are applied to the respective electrodes so as to establish these potential levels, discharge does not occur between the first electrode 1 and the second electrode 2. Therefore, no discharge currents flow between these electrodes.

When the third potential V3 of the third electrode 3 is close to the potential V2 of the second electrode 2, the electric lines of force E are present between the first electrode 1 and the second electrode 2 as shown in FIG. 3(*c*) but the number of electric lines of force is smaller than that of electric lines of force shown in FIG. 3(*a*) and increases or decreases in accordance with the potential V3 of the third electrode 3. Consequently, discharge occurs between the first electrode 1 and the second electrode 2 but is not intense. The magnitude of the discharge current varies with the potential V3 of the third electrode 3.

As described above, with the switching element 100 according to the preset invention, by fixing one of the discharging voltage Vgen applied to the first electrode 1 and the discharge control voltage Vcon applied to the third electrode 3 while varying the other, it is possible to vary the magnitude of the discharge current flowing between the first electrode 1 and the second electrode 2. This in turn makes it possible to control the magnitude of the current I supplied to the switched section 4. That is, the switching element 100 according to the present invention is a three-terminal active element (transistor) using a plasma discharge section as a channel.

The arrangement of the first, second, and third electrodes 1, 2, and 3 will be described below.

As shown in FIG. 4, by providing the third electrode 3 at a position where the electric lines of force E are generated when a predetermined potential difference is applied to between the first electrode 1 and the second electrode 2, it is possible to control the discharge occurring between the first electrode 1 and the second electrode 2.

Moreover, when the third electrode 3 is provided between the first electrode 1 and the second electrode 2 as shown in FIG. 1, the third electrode 3 is present on the discharge path between the first electrode 1 and the second electrode 2. Correspondingly, the discharge (the magnitude of the discharge current) can be easily controlled. The magnitude of the discharge current can thus be controlled by applying a relatively low voltage as the discharge control voltage Vcon applied to the third electrode 3.

Furthermore, by employing the arrangement in which the first and second electrodes 1 and 2 are provided on the same plane on which the third electrode 3 is provided as shown in FIGS. 1(*a*) and 1(*b*), these electrodes can be formed on the same substrate during the same process. Consequently, these electrodes can be simultaneously formed using the same mask or screen. The manufacture of the switching element 100 can thus be simplified.

Of course, the first, second, and third electrodes 1, 2, and 3 may not be provided on the same plane or may be provided on separate supports (for example, separate substrates). This switching element functions as long as the first and second electrodes 1 and 2 are provided so as to generate discharge between them with the third electrode 3 provided at a position where it can control this discharge.

Figure 5:
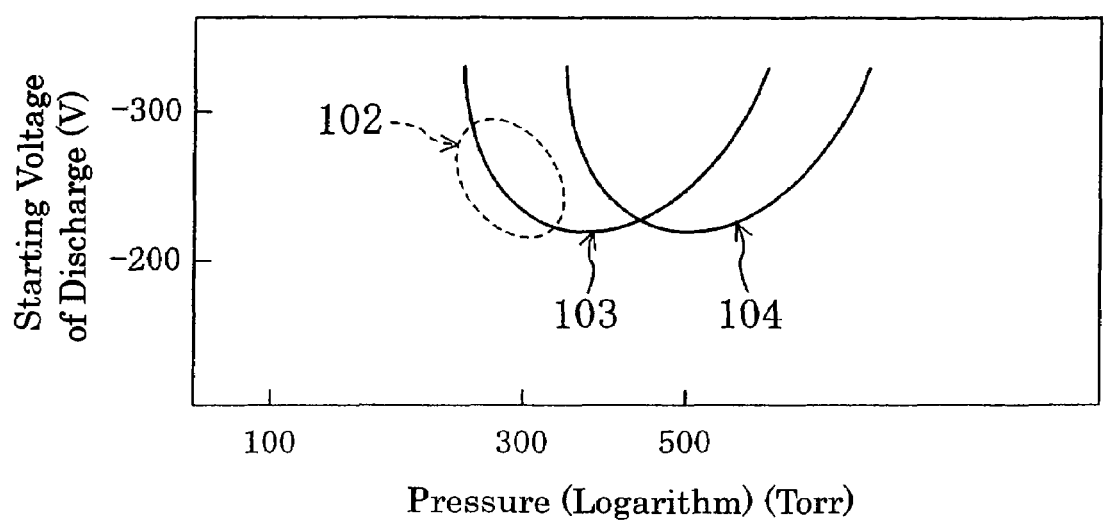
FIG. 5 is a graph showing the dependency of a starting voltage of discharge on pressure in the switching element 100 of Embodiment 1 according to the present invention.

Furthermore, the switching element 100 of the present embodiment includes a discharge gas between the first electrode 1 and the second electrode 2. The pressure of the discharge gas is preferably set so that the starting voltage of discharge between the first electrode 1 and the third electrode 3 is higher than that between the first electrode 1 and the second electrode 2. The starting voltage of discharge is the minimum value of a voltage which generates discharge under predetermined conditions. The reason for this will be described with reference to FIG. 5. FIG. 5 is a graph showing the dependency of the starting voltage of discharge on pressure in the switching element 100. In this figure, a solid line 103 indicates the starting voltage of discharge between the first electrode 1 and the second electrode 2 (the distance between the electrodes is about 130 μm). A solid line 104 indicates the starting voltage of discharge between the first electrode 1 and the third electrode 3 (the distance between the electrodes is about 40 μm).

When the pressure of the discharge gas is set so as to correspond to, for example, an area 102, shown in FIG. 5 and enclosed by a broken line, discharge occurs between the first electrode 1 and the second electrode 2. However, no discharge occurs between the first electrode 1 and the third electrode 3. Consequently, no discharge currents flow between the first electrode 1 and the third electrode 3. It is thus possible to almost zero the power consumed to control the discharge between the first electrode 1 and the second electrode 2. Thus, the switching element 100 with the pressure of the discharge gas set as described above consumes sharply reduced power. Of course, the pressure of the discharge gas is not limited to the area 102, illustrated in FIG. 5. A switching element consuming sharply reduced power is obtained by setting the pressure of the discharge gas so that the starting voltage of discharge between the first electrode 1 and the third electrode 3 is higher than that between the first electrode 1 and the second electrode 2.

In the description of the present embodiment, the switching element 100 includes helium as a discharge gas. However, the atmosphere (nitrogen and oxygen) may be used at the atmospheric pressure as a discharge gas. If the atmosphere is utilized at the atmospheric pressure, it is possible to omit the steps of forming a gas sealing structure and sealing the discharge gas. Therefore, manufacturing costs can be reduced.

The operational principle of the switching element 100 has been described above using the relationship between the relative magnitudes of the potentials of the first, second, and third electrodes 1, 2, and 3 as well as the electric lines of force generated between these electrodes. Now, the operational principle of the switching element 100 will be described from a difference viewpoint. In the description below, it is assumed that voltages are applied to the first and second electrodes 1 and 2 so that the potential V2 of the second electrode 2 is sufficiently higher than the potential V1 of the first electrode 1 (V2>>V1).

If the third electrode 3 is not present, when discharge occurs, intense electric fields in which equipotential surfaces EQ are concentrated (the intervals between the equipotential surfaces are small) are generated near the negative potential-side electrode (first electrode 1). In other areas, weak electric fields are generated. Thus, a stable potential profile is formed in the discharge space.

On the other hand, if the third electrode 3 is present, the potential profile of the discharge space (the distribution of equipotential surfaces EQ in the discharge space) varies with the potential applied to the third electrode 3 as shown in FIGS. 6(*b*) to 6(*f*).

First, when the potential V3 of the third electrode 3 is higher than the potential V2 of the second electrode 2 (V3>V2>>V1), the potential profile of the discharge space is markedly disturbed by the potential V3 of the third electrode 3 as shown in FIG. 6(*b*). Accordingly, a potential profile preferable for maintaining discharge is not present along the discharge path. Thus, no discharge currents flow.

When the potential V3 of the third potential 3 is almost the same as the potential V2 of the second electrode 2 (V3=V2>>V1), the potential profile of the discharge space is slightly disturbed by the potential V3 of the third electrode 3 as shown in FIG. 6(*c*). A potential profile is thus formed in which equipotential surfaces EQ are mainly present between the first electrode 1 and the third electrode 3. Thus, although a discharge current flows, its magnitude is smaller than that shown in FIG. 6(a).

When the potential V3 of the third electrode 3 is between the potential V1 of the first electrode 1 and the potential V2 of the second electrode 2 and is slightly lower than the potential V2 of the second electrode 2 (V2>V3>>V1), the potential profile of the discharge space is similar to that shown in FIG. 6(a) (the third electrode 3 is not present) and is stable as shown in FIG. 6(d). A discharge path 101 is kept thick to increase the discharge current.

When the potential V3 of the third electrode 3 is between the potential V1 of the first electrode 1 and the potential V2 of the second electrode 2 and is sufficiently lower than the potential V2 of the second electrode 2 (V2>>V3>>V1), the potential profile of the discharge space is slightly disturbed by the potential V3 of the third electrode 3 as shown in FIG. 6(e). The discharge patch 101 leaves the third electrode 3 and becomes thinner to reduce the discharge current. As the potential V3 of the third electrode 3 further decreases, the potential profile of the discharge space is significantly disturbed by the potential V3 of the third electrode 3 as shown in FIG. 6(f). No potential profiles preferable for maintaining discharge are present along the discharge path. Thus, no discharge currents flow.

As described above, the third electrode 3 of the switching element 100 has a function of disturbing the potential profile of discharge occurring between the first electrode 1 and the second electrode 2, i.e. a function of varying the distribution of equipotential surfaces EQ attributed to discharge occurring between the first electrode 1 and the second electrode 2. This enables the control of the discharge between the first electrode 1 and the second electrode 2.

FIG. 7 shows the element characteristics of the switching element 100. FIG. 7 shows the discharge control voltage Vcom, indicated by the axis of abscissa in FIG. 2(a), up to a larger value. In FIG. 7, points corresponding to FIGS. 6(b) to 6(f) are shown using reference characters (b) to (f).

As shown in FIG. 7, the switching element 100 operates the state shown in FIGS. 6(b) and 6(f) as an off-state, and the state shown in FIGS. 6(c), 6(d), and 6(e) as an on-state.

The size and arrangement of the third electrode 3 are selected in accordance with the required element characteristics. The size and arrangement of the third electrode 3 determine the magnitude of a voltage applied to the third electrode 3 (or the potential V3 of the third electrode 3) and required to disturb the potential profile of discharge occurring between the first electrode 1 and the second electrode 2. Accordingly, by appropriately selecting the size and arrangement of the third electrode 3, it is possible to vary the magnitude of the required voltage applied to the third electrode 3.

For example, by increasing the size of the third electrode 3, it is possible to reduce the magnitude of the voltage applied to the third electrode 3 and required to disturb the potential profile of discharge. Alternatively, the magnitude of the voltage applied to the third electrode 3 can be reduced by arranging the third electrode 3 between the first electrode 1 and the second electrode 2 or close to them.

When the magnitude of the voltage applied to the third electrode 3 and required to disturb the potential profile of discharge is small, it is possible to reduce the withstanding voltage of a driver externally connected to the element in order to drive the third electrode 3. The magnitude of the voltage applied to the third electrode 3 may be reduced by increasing the size (e.g. the area) of the third electrode 3 or accurately arranging the third electrode 3 between the first electrode 1 and the second electrode 2 or close to them as described above.

(Embodiment 2)

A display device 200 of Embodiment 2 according to the present invention will be described with reference to FIGS. 8, 9(a), and 9(b). FIG. 8 is a plan view schematically showing the display device 200. FIGS. 9(a) and 9(b) are a perspective view and a sectional view, respectively, which schematically show an area corresponding to one pixel in the display device 200.

The display device 200 includes a plurality of pixels arranged in a matrix having rows and columns. The display device 200 includes the switching element 100 of Embodiment 1 for each of the plurality of pixels. The first, second, and third electrodes 1, 2, and 3 of the switching element 100 are formed on a substrate 13. A discharge gas is sealed between the substrate 13 and a counter substrate 14 opposite to the substrate 13.

The display device 200 also includes a scanning line (gate line) 8 electrically connected to the first electrode 1 of the switching element 100, signal line (data line) 9 electrically connected to the third electrode 3, organic EL element 4' connected to the second electrode 2 as a switched section.

The scanning line 8 and the signal line 9 are provided for each row and for each column, respectively. The scanning line 8 is electrically connected to a gate driver 12 provided outside a display area and is supplied with a scanning voltage (gate voltage) by the gate driver 12. The signal line 9 is electrically connected to a gate driver 11 provided outside the display area and is supplied with a signal voltage (data voltage) by the gate driver 11. The display device 200 further includes ground line 10 electrically connected to the counter electrode 6 and grounded outside the display area.

The organic EL element 4' has a pixel electrode 5 electrically connected to the second electrode 2, a counter electrode 6 opposed to the pixel electrode 5, and an organic EL (Electro Luminescence) material layer 7 provided between the pixel electrode 5 and the counter electrode 6 as a display medium layer. The organic EL element 4' is supplied with a current to emit light.

Figure 10A:
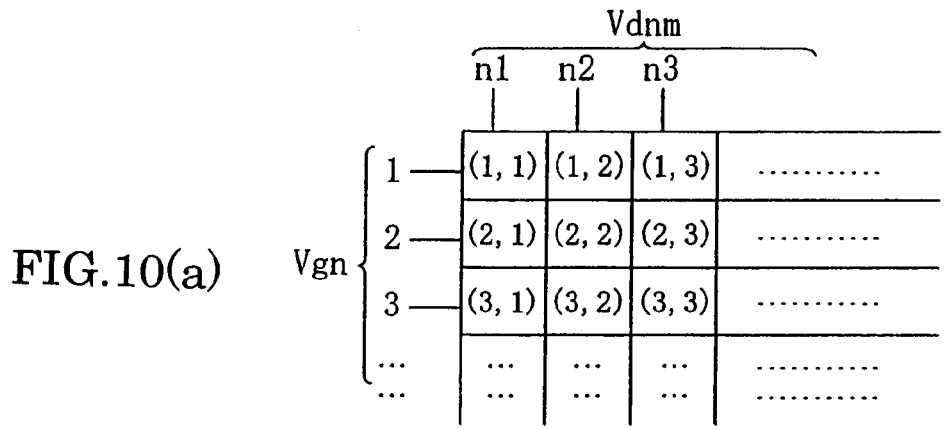
FIGS. 10(a), 10(b), and 10(c) are diagrams illustrating a method of driving the display device 200 of Embodiment 2 according to the present invention.
Figure 10B:
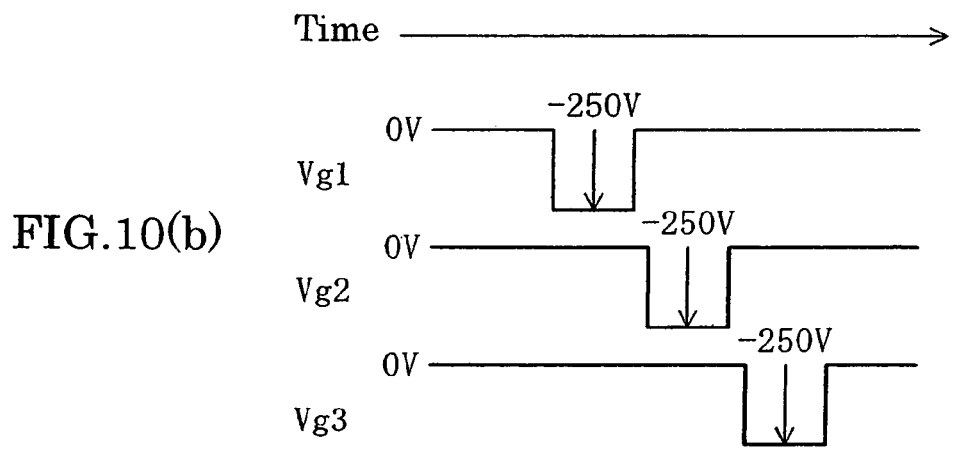
Figure 10C:
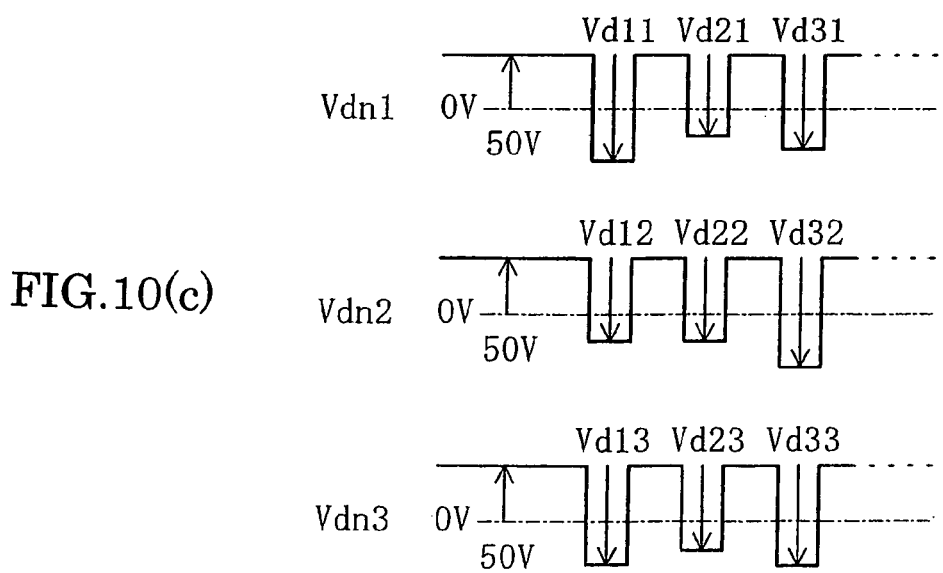

With reference to FIGS. 10(a), 10(b), and 10(c), description will be given of a method of driving the display device 200 of the present embodiment. As schematically shown in FIG. 10(a), the display device 200 has a plurality of pixels arranged in a matrix. In FIG. 10(a), a pixel in the n-th row and the m-th column is represented as (n, m).

First, the gate driver 12 sequentially supplies scanning voltages (gate voltages) Vgn (Vg1, Vg2, Vg3, . . .) to the scanning line 8 provided for the each row, starting with the first row. The first electrode 1 of each switching element 100 is supplied with the scanning voltage Vgn via the scanning line 8. As shown in FIG. 10(b), the gate driver 12 generates pulse voltages having a fixed amplitude (the magnitude of the voltage; in this case, −250 V) and a fixed pulse width (in this case, 10 µs).

In synchronization with this supply, the data driver 11 supplies signal voltages (data voltages) Vdnm (Vdn1, Vdn2, Vdn3, . . .) to the signal line 9, provided for the each column, using predetermined timings. The signal voltage Vdnm is supplied, via the signal line 8, to the third electrode 3 of the switching element 100, provided for each pixel. As shown in FIG. 10(c), the data driver 11 generates pulse voltages having a fixed pulse width and an amplitude (the magnitude of the voltage; Vd11, Vd21, Vd31, . . .) corresponding to each data. Of course, the data driver 11 may generate pulse voltages having a fixed amplitude and a pulse width varying in association with individual data.

Each pixel is brought into a predetermined display state in response to the signal voltage Vdnm as a discharge control voltage applied to the third electrode 3. If the discharge control voltage applied to the third electrode 3 is such that no discharge occurs between the first electrode 1 and the second electrode 2, i.e. it is an off voltage, then no currents are supplied to the organic EL element 4' as a switched section. Accordingly, the organic EL element 4' does not emit light. On the other hand, if the discharge control voltage applied to the third electrode 3 is such that discharge occurs between the first electrode 1 and the second electrode 2, i.e. it is an on voltage, then a current is supplied to the organic EL element 4'. Accordingly, the organic EL element 4' emits light. At this time, the magnitude of the current supplied to the organic EL element 4' varies depending on the discharge control voltage. Consequently, the luminance of the organic EL element 4' can be varied to accomplish multi-gradation display.

As described above, the display device 200 of the present embodiment accomplishes active matrix driving.

In the display device 200 of Embodiment 2 according to the present invention, the switching element 100 provided for each pixel is configured as described above. It is thus unnecessary to form the first, second, and third electrodes 1, 2, and 3 using separate processes. This simplifies the manufacture of the display device 200. Furthermore, as described above, switching operations are performed by controlling discharge, so that no off currents are generated in contrast with thin film transistors (TFT) Moreover, the constitution in which the first, second, and third electrodes do not overlap one another via insulating films can be adopted. This prevents delays or disturbances in electric signals caused by a capacitance formed in an overlapping portion. It is thus possible to easily increase the size of the display device.

Furthermore, the display device 200 is superior to conventional address devices such as the one disclosed in Japanese Patent Laid-Open No. 9-120270, in the points described below.

First, the second electrode 2 and the pixel electrode 5 are directly coupled together through wiring rather than being short-circuited via a discharge space. This avoids the adverse effects of a sheath voltage caused by plasma. Consequently, no bias voltages need to be added. Furthermore, charges or currents are supplied to the pixel electrode 5 via wiring, so that there is no nonuniformity resulting from an area inside the switched section. Moreover, since the switched section is supplied with charges or currents by a discharge current via wiring, once the discharging voltage is turned off, the supply of charges or currents is immediately stopped. Therefore, quick switching operations can be accomplished.

The display device 200 of the present embodiment can be manufactured, for example, as described below. In the display device 200 of the present embodiment, one pixel is 486 μm×162 μm in size. The display device 200 has pixels of this size arranged so as to correspond to a 42-inch panel and thus provides a "high definition".

First, the first electrode 1, the second electrode 2, the third electrode 3, the counter electrode 6, the scanning line (gate line) 8, and the ground wire 10 are formed on the substrate 13 having an insulating surface. In this case, the substrate 13 is composed of soda glass and is about 3 mm in thickness and about 650 mm×about 1,050 mm in size. The material for the above electrodes and wires is nickel. The electrodes and wires are formed using the screen printing method. First, a nickel paste containing nickel powders and a binder material is applied to the substrate by being passed through a mesh portion of a screen printing plate having a predetermined pattern. Then, the nickel paste applied to the substrate is dried and solidified at about 300° C. Subsequently, the nickel paste is fired at about 600° C. to make it conductive.

The sizes of the first, second, and third electrodes 1, 2, and 3 and the intervals between them are the same as those of the switching element 100 of Embodiment 1. The scanning line 8 and the ground line 10 have a line width of about 30 μm and a thickness of 15 μm. The counter electrode 6 has a size of 140 μm×about 80 μm and a thickness of about 15 μm.

The method of forming the electrodes and wires is not limited to the screen printing method. A sand blast method or a photosensitive paste method may be used to form a thick film of thickness 1 μm or more. Alternatively, a sputtering method or an electron beam deposition method may be used to form a thin film of thickness 1 μm or less, and a dry or wet etching process may be executed to form a predetermined electrode pattern (shape). When the screen printing method is used as in the case of the present embodiment, the electrodes and wires can be easily formed. Alternatively, it is allowable to form, on the surfaces of the electrodes formed as described above, a film composed of a material such as a lanthanum hexaboride, gadolinium hexaboride, or magnesium oxide which has a large secondary electron emission coefficient and a high sputter resistance. Such a film can be formed using, for example, an electrode position method, the sputtering method, or the electron beam deposition method.

Then, the organic EL material layer 7 is formed so as to cover at least a part of the counter electrode 6. In this case, the organic EL material layer 7 that is about 180 μm×about 110 μm in size and about 0.1 μm in thickness is formed using a vacuum deposition method to apply tris (8-hydroxyquinolinato) aluminum and using a metal mask method to pattern this material.

Subsequently, the signal line 9 is formed. In this case, nickel is used as a material for the signal line 9 and the screen printing method is executed to form a signal line 9 having a line width of about 30 μm and a thickness of about 15 μm. The signal line 9 and the scanning line 8 are insulated from each other by an insulating film (not shown in the drawings) formed in their crossing portion and composed of a photosensitive acrylic resin.

Then, the pixel electrode 5 is formed which is opposite to the counter electrode 6 via the organic EL material layer 7. First, the sputtering method is used to accumulate ITO (Indium Tin Oxide) so as to cover the organic EL material layer 7. Then, the screen printing method is used to apply a resist material to the ITO so as to form a predetermined pattern. Parts of the ITO to which the resist material has not been applied are etched away. Subsequently, the resist material is removed to form a pixel electrode 5 that is about 140 μm×about 80 μm in size and about 15 μm in thickness.

Subsequently, a gas sealing structure is formed, and a discharge gas is sealed in this structure. First, a frit material mainly composed of glass is applied to the substrate so as to surround a display area composed of a plurality of pixel areas. Then, a spacer defining the height of a gas sealing structure (height: about 300 μm) and the counter substrate 14 are arranged in position and then fired at about 600° C. to form a gas sealing structure in which the substrate 13 on which the electrodes have been formed and the counter substrate 14 are glued to each other using the frit material. Subsequently, the gas sealing structure is evacuated, and helium as a discharge gas is sealed in the structure at a pressure of about 300 Torr (about 40 kPa).

The display device 200 of the present embodiment is formed as described above. With the illustrated manufacturing method, the screen printing method is used to simultaneously form a first electrode 1, a second electrode 2, a third electrode 3, a counter electrode 6, a scanning line 8, a signal line 9, and a ground line 10. Photolithography is used to form an insulating film at the crossing portion between the scanning line 8 and the signal line 9. The pixel electrode 5 is patterned using the screen printing method. Thus, compared to the manufacture of conventional display devices comprising a TFT as a switching element, the numbers of masks and photolithography steps required decrease drastically. Therefore, manufacturing costs decrease.

In the description of the present embodiment, the organic EL element 4' is provided as the switched section. However, the present invention is not limited to this aspect. Selfluminous elements or light modulation elements may be suitably used. Alternatively, it is allowable to use resistive elements such as the organic EL element 4' or capacitive elements such as a liquid crystal layer sandwiched between a pair of electrodes.

Figure 11A:
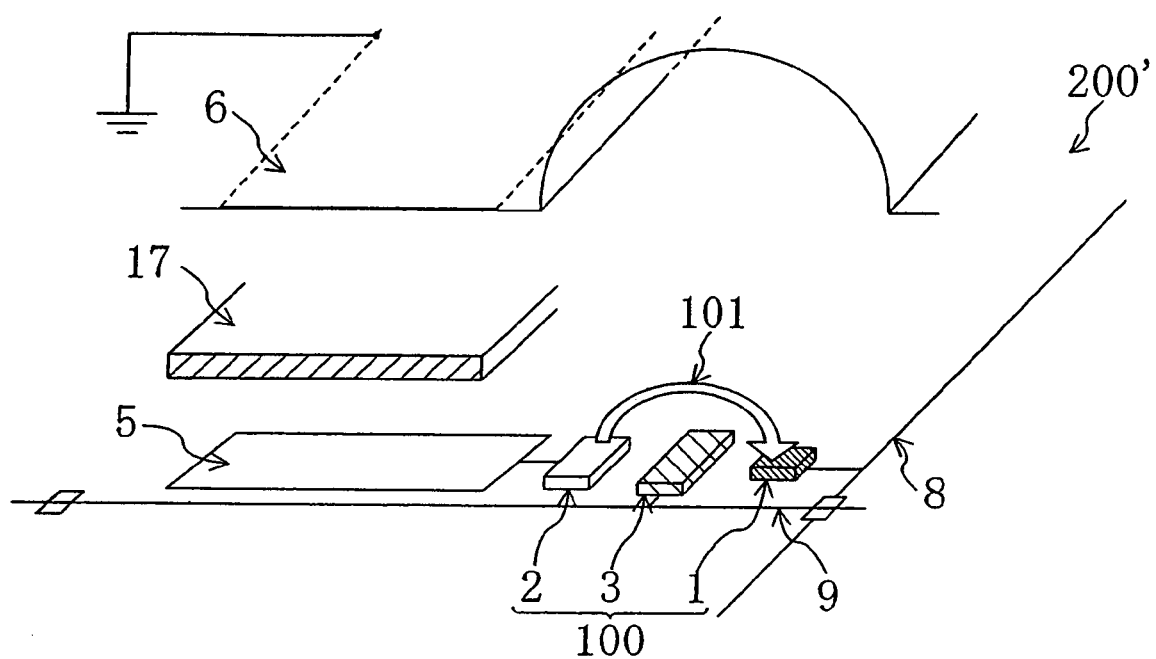
FIG. 11(a) is a perspective view schematically showing an area corresponding to one pixel in a display device 200' of Embodiment 2 according to the present invention.
Figure 11B:
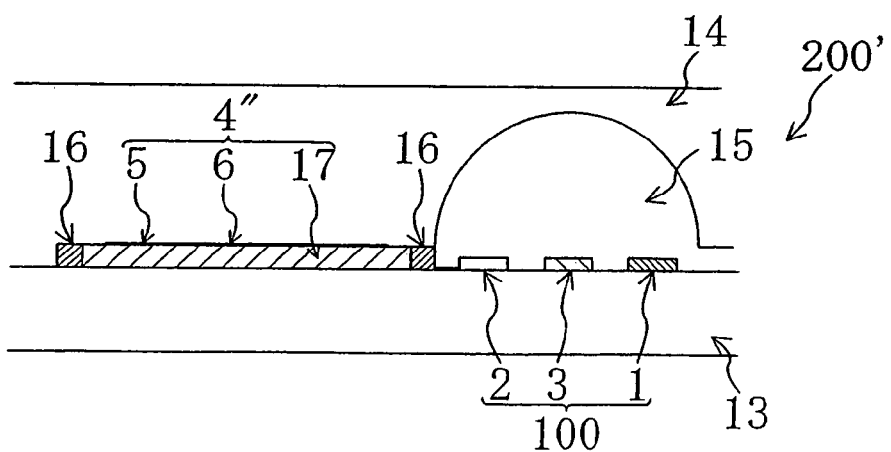
FIG. 11(b) is a sectional view schematically showing an area corresponding to one pixel in the display device 200' of Embodiment 2 according to the present invention.

With reference to FIGS. 11(a) and 11(b), description will be given of a display device 200' including, as a switched section, a liquid crystal capacitance 4' formed by the pixel electrode 5, the counter electrode 6, and a liquid crystal layer 17 sandwiched between them. FIGS. 11(a) and 11(b) are a perspective view and a sectional view, respectively, which schematically show an area corresponding to one pixel in the display device 200'. The display device 200' has the same configuration as that of the display device 200 except that it includes the liquid crystal capacitance 4" as a switched section. In the description below, differences from the display device 200 will be mainly described. In FIGS. 11(a) and 11(b), the same reference numerals as those of the display device 200 are used for components having substantially the same functions as those of the corresponding components of the display device 200.

The display device 200' includes the liquid crystal capacitance 4" as a switched section. The liquid crystal capacitance 4" is driven using the switching element 100. The switched section of the display device 200' is a light modulation element. Accordingly, the display device 200' provides display by using light from a backlight or using a reflector (or reflecting electrode) to reflect ambient light (extraneous light).

The liquid crystal layer 17 of the liquid crystal capacitance 4" is sealed in an area surrounded by a liquid crystal sealing wall 16 provided on the substrate 13, the substrate 13, and the counter substrate 14. In this case, the spacing between the substrate 13 and the counter electrode 14 is about 5 μm.

The pixel electrode 5 is provided on a side of the substrate 13 which is closer to the liquid crystal layer 17. The counter electrode 6 composed of ITO is provided on a side of the counter substrate 14 which is closer to the liquid crystal layer 17. A rubbed orientation layer is formed on the substrate 13 and on the counter substrate 14 so as to contact with the liquid crystal layer 17. The counter electrode 14 has a polarization control layer and a color filter layer (neither of them are shown) on its side opposite to the liquid crystal layer 17.

A discharge gas is sealed in a space 15 formed adjacent to the liquid crystal layer 17 via the liquid crystal sealing wall 16. The counter substrate 14 is diced so that the space 15 is about 100 μm in height.

The display device 200' configured as described above accomplishes active matrix driving and thus has advantages similar to those of the display device 200.

(Embodiment 3)

Figure 12:
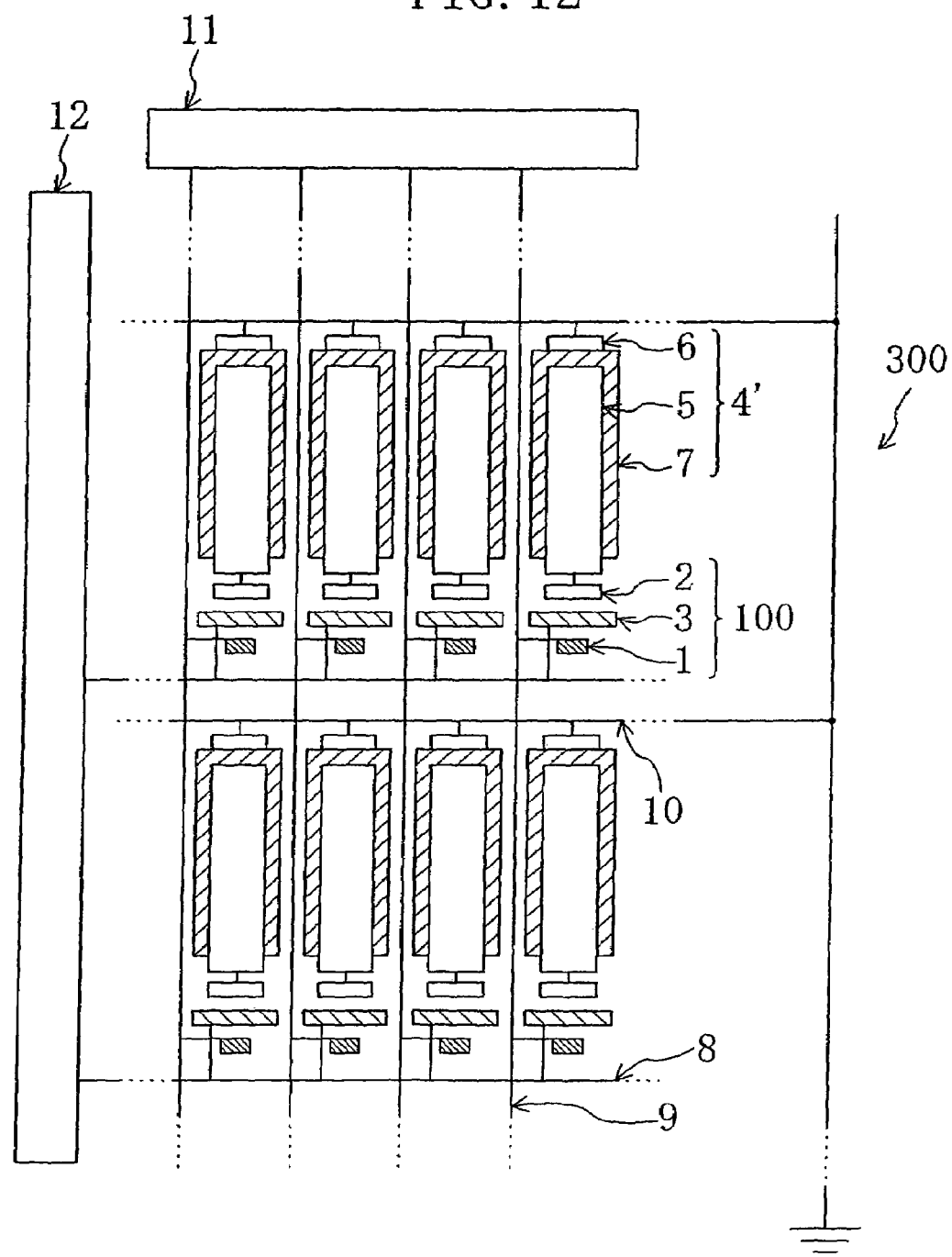
FIG. 12 is a plan view schematically showing a display device 300 of Embodiment 3 according to the present invention.

A display device 300 of Embodiment 3 according to the present invention will be described with reference to FIGS. 12, 13(a), and 13(b). FIG. 12 is a plan view schematically showing the display device 300. FIGS. 13(a) and 13(b) are a perspective view and a sectional view, respectively, which schematically show an area corresponding to one pixel in the display device 300.

The display device 300 of Embodiment 3 differs from the display device 200 of Embodiment 2 in that the first electrode 1 of the switching element 100 is electrically connected to the signal line (dataline) 9, while the third electrode 3 is electrically connected to the scanning line (gate line) 8. In the description below, differences from the display device 200 will be mainly described. In the subsequent drawings, the same reference numerals as those of the display device 200 are used for components having substantially the same functions as those of the corresponding components of the display device 200.

Figure 14A:
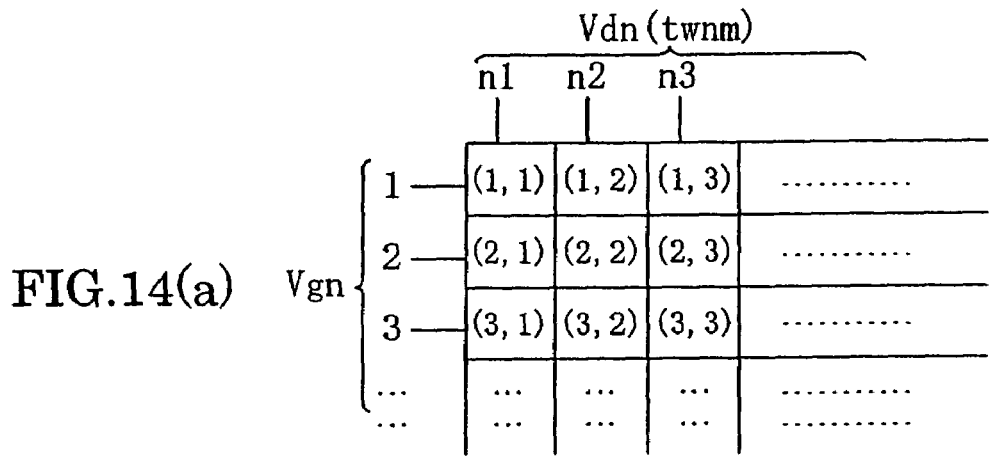
FIGS. 14(a), 14(b), and 14(c) are diagrams illustrating a method of driving the display device 300 of Embodiment 3 according to the present invention.
Figure 14B:
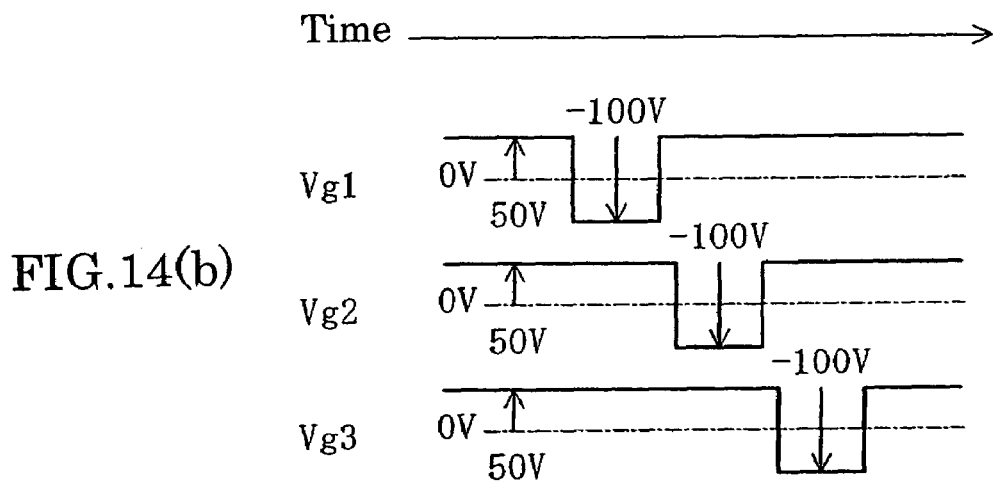
Figure 14C:
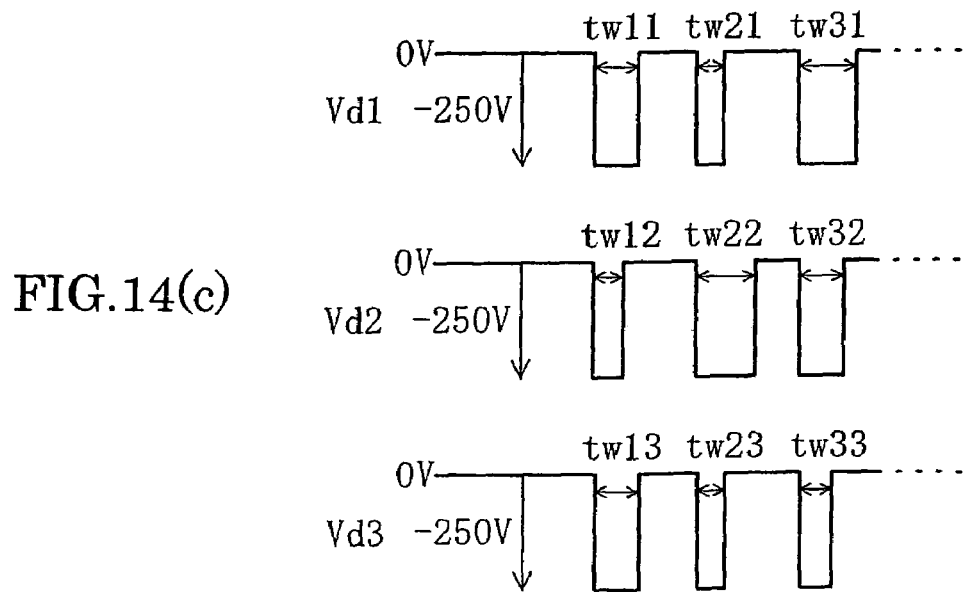

As described above, in the display device 300, the first electrode 1 is electrically connected to the signal line (data line) 9, while the third electrode 3 is electrically connected to the scanning line (gate line) 8. With reference to FIGS. 14(a), 14(b), and 14(c), description will be given of a method of driving the display device 300 structured as described above.

As schematically shown in FIG. 14(a), the display device 300 has a plurality of pixels arranged in a matrix. In FIG. 14(a), a pixel in the n-th row and the m-th column is represented as (n, m).

First, the gate driver 12 sequentially supplies scanning voltages (gate voltages) Vgn (Vg1, Vg2, Vg3, . . .) to the scanning line 8 provided for the each row, starting with the first row. The third electrode 3 of switching element 100 is supplied with the scanning voltage Vgn via the scanning line 8. As shown in FIG. 12(b), the gate driver 12 generates pulse voltages having a fixed amplitude (the magnitude of the voltage; in this case, −100 V) and a fixed pulse width (in this case, 15 μs).

In synchronization with this supply, the data driver 11 supplies signal voltages (data voltages) Vdnm (Vdn1, Vdn2, Vdn3, . . .) to the signal line 9, provided for the each column, using predetermined timings. The signal voltage Vdnm is supplied, via the signal line 8, to the first electrode 1 of the switching element 100, provided for each pixel. As shown in FIG. 14 (c), the data driver 11 generates pulse voltages having a fixed amplitude (the magnitude of voltage) and a pulse width corresponding to each data. Of course, the data driver 11 may generate pulse voltages having a fixed pulse width and an amplitude varying in association with individual data.

Each pixel is brought into a predetermined display state in response to the discharge between the first electrode 1 and the second electrode 2. In the display device 300, a discharge control voltage (scanning voltage Vgn) applied to the third electrode 3 is fixed, whereas the discharging voltage (signal voltage Vdnm) applied to the first electrode 1 varies. However, the discharge control voltage corresponds to an on voltage or an off voltage depending on the magnitude of the discharging voltage. When the discharging voltage is applied which has a magnitude equivalent to the discharge control voltage corresponding to the off voltage, no currents are supplied to the organic EL element 4' as a switched section. Accordingly, the organic EL element 4' does not emit light. On the other hand, when the discharging voltage is applied which has a magnitude equivalent to the discharge control voltage corresponding to the on voltage, a current is supplied to the organic EL element 4'. Accordingly, the organic EL element 4' emits light. At this time, the magnitude of the current supplied to the organic EL element 4' varies depending on the discharging voltage. Consequently, the luminance of the organic EL element 4' can be varied to accomplish multi-gradation display.

The display device 300 of the present embodiment and thus has advantages similar to those of the display device 200.

(Embodiment 4)

Figure 15A:
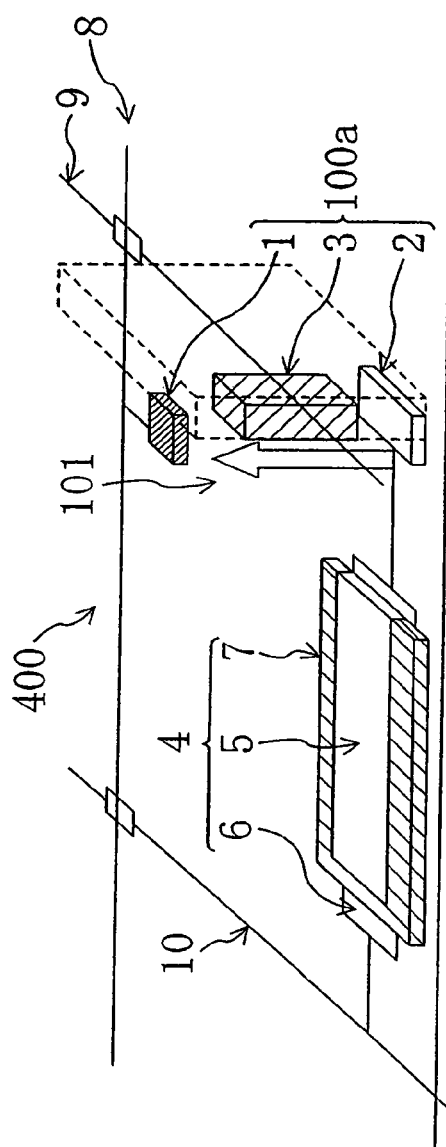
FIG. 15(a) is a perspective view schematically showing an area corresponding to one pixel in a display device 400 of Embodiment 4 according to the present invention.
Figure 15B:
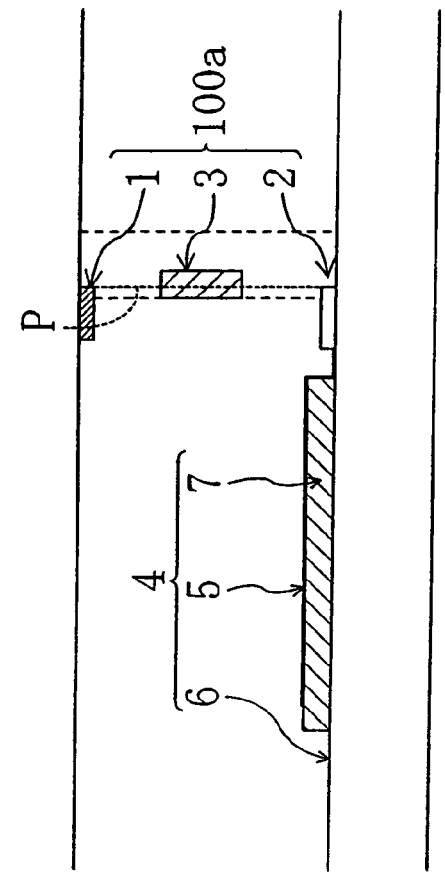
FIG. 15(b) is a sectional view schematically showing an area corresponding to one pixel in the display device 400 of Embodiment 3 according to the present invention.

A display device 400 of Embodiment 4 according to the present invention will be described with reference to FIGS. 15(*a*) and 15(*b*). FIGS. 15(*a*) and 15(*b*) are a perspective view and a sectional view, respectively, which schematically show an area corresponding to one pixel in the display device 400. In the description below, differences from the display device 200 of Embodiment 2 will be mainly described.

As shown in FIGS. 15(*a*) and 15(*b*), the display device 400 differs from the display device 200 including the switching element 100, shown in FIG. 1 and other figures, in that it includes a switching element 100*a* having the first and second electrode 1 and 2 provided opposite each other and the third electrode 3 provided between the first electrode 1 and the second electrode 2.

As described above, the first and second electrodes 1 and 2 of the switching element 100*a* are arranged opposite each other, that is, in such a manner that their principal surfaces face each other. The third electrode 3 is provided to lie between the first electrode 1 and the second electrode 2. Accordingly, the switching element 100*a* can be configured to be smaller than the switching element 100. Thus, the area of the pixels occupied by the switching element 100*a* is smaller. As a result, the aperture is advantageously improved.

For example, the switching element 100 is compared with the switching element 100*a* in which the sizes of the first, second, and third electrodes 1, 2, and 3 and the intervals between them are similar to those of the switching element 100. In Embodiment 1 (or 2), the size of the switching element 100 is 100 μm (length)×230 μm (width)×about 50 μm (the height of the discharge path 101). In contrast, the size of the switching element 100*a* is 100 μm×160 μm×50 μm. The switching element 100*a* is thus configured to be more compact than the switching element 100. In the switching element 100*a*, the first and second electrodes 1 and 2 are provided opposite each other. Accordingly, the discharge path 101 is not shaped like an arch but almost like a straight line as shown in FIG. 15(*a*). Thus, the discharge path 101 is accommodated within the above dimensions.

In the display device 200 of Embodiment 2, the switching element 100 is formed on the same plane on which the switched section 4 is provided. In contrast, in the display device 400 of the present embodiment, the switching element 100*a* is not located on the same plane on which the switched section 4 rests. However, the display device provides the same functions regardless of whether or not the switching element 100*a* and the switched section 4 are present on the same plane.

Furthermore, in the present embodiment, of the scanning line 8, connected to the first electrode 1, and the signal line 9, connected to the third electrode, and the ground line 10, connected to the counter electrode 6, the scanning line 8 is arranged so as not to be parallel with a plane P defined by the first, second, and third electrodes 1, 2, and 3 (a virtual plane containing some of a group of straight lines joining the first, second, and third electrodes 1, 2, and 3). Accordingly, in the display device 400 of the present embodiment, the wires do not overlap one another and thus need not be insulated from one another. Thus, the display device 400 of the present embodiment is easy to manufacture. Of course, the present invention is not limited to the arrangement in which the scanning line 8 is not parallel with the plane P as in the case of the present embodiment. Similar advantages are obtained by employing the arrangement in which at least one of the scanning line 8, signal line 9, and ground line 10 is not parallel with the plane P.

The switching element 100*a* can be manufactured, for example, as described below. First, a first and second electrodes 1 and 2 are formed on separate substrates using the screen printing method or the like. Then, a dielectric wall is formed on one of the substrates using the sand blast method or the like, the dielectric wall containing the third electrode 3 and the signal line 9 and also functioning as a spacer. Subsequently, the substrates are laminated with each other using a frit material. Thus, the switching element 100*a* shown in FIGS. 15(*a*) and 15(*b*) is obtained.

(Embodiment 5)

Figure 16A:
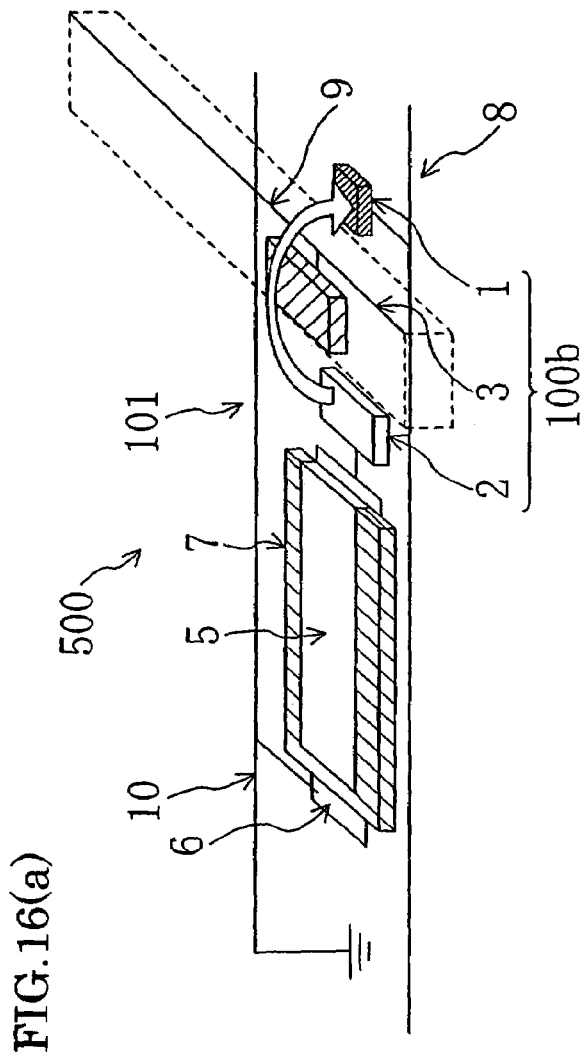
FIG. 16(a) is a perspective view schematically showing an area corresponding to one pixel in a display device 500 of Embodiment 5 according to the present invention.
Figure 16B:
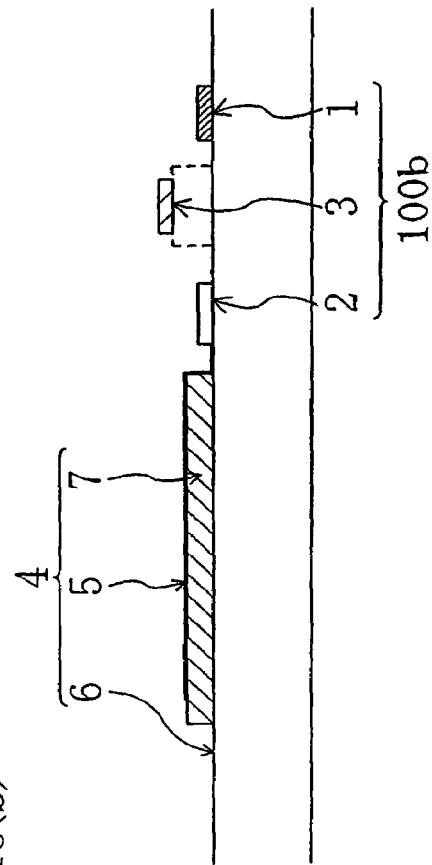
FIG. 16(b) is a sectional view schematically showing an area corresponding to one pixel in the display device 500 of Embodiment 5 according to the present invention.

A display device 500 of Embodiment 5 according to the present invention will be described with reference to FIGS. 16(*a*) and 16(*b*). FIGS. 16(*a*) and 16(*b*) are a perspective view and a sectional view, respectively, which schematically show an area corresponding to one pixel in the display device 500. In the description below, differences from the display device 200 of Embodiment 2 will be mainly described.

As shown in FIGS. 16(*a*) and 16(*b*), the display device 500 differs from the display device 200 in that it includes a switching element 100*b* having the third electrode 3 provided so as to lie on a plane different from that on which the first and second electrode 1 and 2 are located, the display device 200 including the switching element 100, in which the first, second, and third electrodes 1, 2, and 3 are provided on the same plane as shown in FIG. 9 and other figures.

In the switching element 100, in which the electrodes are provided on the same plane, the electrode intervals must be accurately controlled so as to insulate the electrodes from one another and to allow the switching elements to exhibit the same discharge characteristics. In contrast, in the switching element 100*b*, the third element 3 is provided on a plane different from that on which the first and second electrodes 1 and 2 are located. In other words, since the third electrode 3 is provided so as not to lie on the same plane as that on which the first and second electrodes 1 and 2 are located, the electrodes can be easily insulated from one another. Furthermore, the electrode intervals need not be accurately controlled. Thus, for example, the electrode intervals can be reduced, and the switching element 100*b* can thus be configured to be smaller than the switching element 100. Consequently, the switching element can be made more compact by employing the arrangement in which the third electrode 3 is provided on the plane different from that on which the first and second electrodes 1 and 2 are located. Therefore, for example, the aperture can be improved.

The switching element 100*b* can be manufactured, for example, as described below. First, a first and second electrodes 1 and 2 are formed on the same substrate using the screen printing method or the like. Then, a stripes-like dielectric layer is formed on the substrate on which the first and second electrodes 1 and 2 are formed, using the sandblast method or the like. Subsequently, a third electrode 3 and a signal line 9 are formed on the dielectric layer using the screen printing method or the like. Thus, the switching element 100*b* shown in FIGS. 16(*a*) and 16(*b*) is obtained.

(Embodiment 6)

Figure 17B:
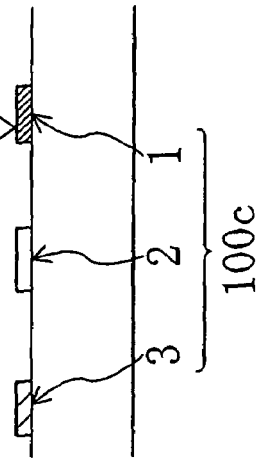
FIG. 17(b) is a sectional view showing the switching element 100c of Embodiment 6 according to the present invention.
Figure 17A:
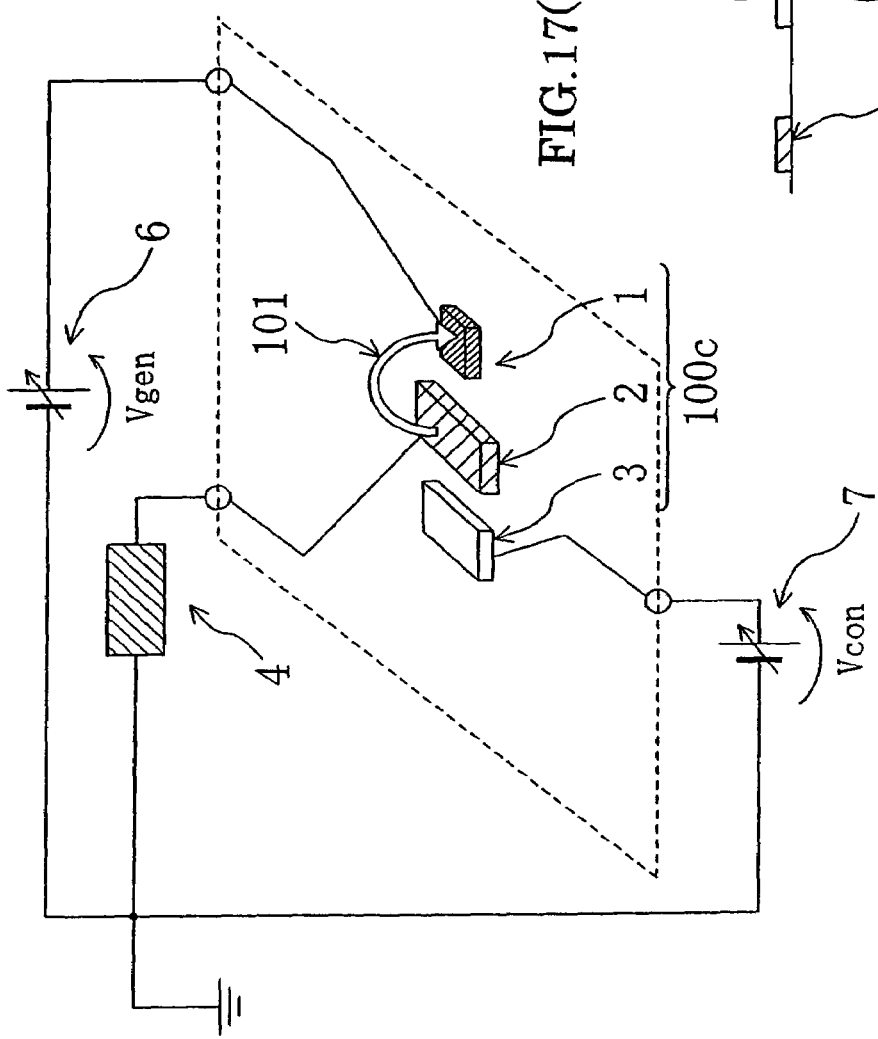
FIG. 17(a) is a perspective view schematically showing a switching element 100c of Embodiment 6 according to the present invention.
Figure 18A:
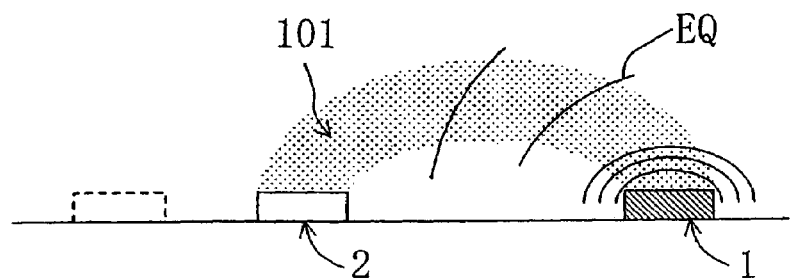
FIGS. 18(a) to 18(d) are diagrams showing a potential profile present in a discharge space of the switching element 100c.
Figure 18B:
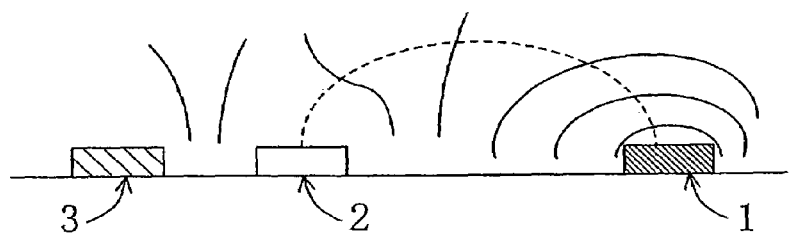
Figure 18C:
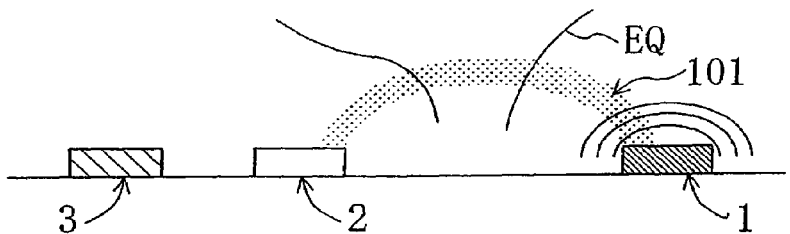
Figure 18D:
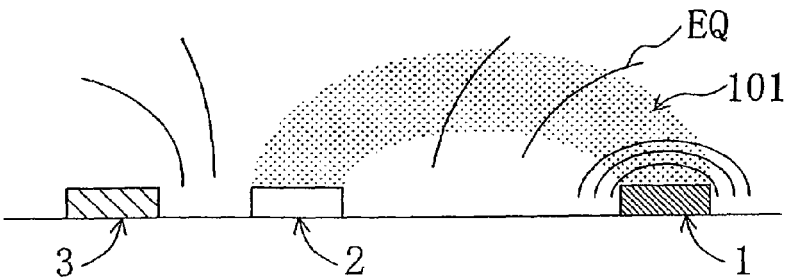

A switching element 100*c* of Embodiment 6 according to the present invention will be described with reference to FIGS. 17(*a*) and 17(*b*). FIGS. 17(*a*) and 17(*b*) are a perspective view and a sectional view, respectively, which schematically show the switching element 100*c*. In the description below, differences from the switching element 100 of Embodiment 1 will be mainly described.

The switching element 100*c* has the third electrode 3 provided so as not to lie between the first electrode 1 and the second electrode 2. Specifically, the third electrode 3 is located opposite the first electrode 1 with respect to the second electrode 2. That is, the first, second, and third electrodes 1, 2, and 3 are arranged in this order; the second electrode 2 is located between the first electrode 1 and the third electrode 3.

FIGS. 18(*a*) to 18(*d*) show a variation in the potential profile (a variation in the distribution of equipotential surfaces) in the switching element 100*c*.

If the third electrode 3 is not present, when discharge occurs, intense electric fields are generated in which equipotential surfaces EQ are concentrated (the intervals between the equipotential surfaces EQ are small) near the negative potential-side electrode (first electrode 1), with weak electric fields generated in the other parts. Thus, a stable potential profile is formed in the discharge space.

On the other hand, if the third electrode 3 is present, the potential profile of the discharge space (the distribution of equipotential surfaces EQ in the discharge space) varies depending on the potential applied to the third potential 3, as shown in FIGS. 18(*b*) to 18(*d*).

When the potential V3 of the third electrode 3 is higher than the potential V2 of the second electrode 2 (V3>V2>>V1), the potential V3 of the third electrode distorts equipotential surfaces EQ present above the second electrode 2, as shown in FIG. 18(*b*). Accordingly, the potential profile characteristic of discharge cannot be maintained. Thus, no discharge occurs between the first electrode 1 and the second electrode 2, and no discharge current flows.

When the potential V3 of the third electrode 3 is almost the same as the potential V2 of the second electrode 2 (V3=V2>>V1), the potential profile of the discharge space is slightly disturbed by the potential V3 of the third electrode 3 as shown in FIG. 18(*c*). However, a discharge current flows. The magnitude of the discharge current is smaller than that shown in FIG. 18(*a*).

When the potential V3 of the third electrode 3 is between the potential V1 of the first electrode 1 and the potential V2 of the second potential 2 and is lower than the potential V2 of the second electrode 2 (V2>V3>>V1), the potential V3 of the third electrode 3 does not distort the equipotential surfaces EQ present around the second electrode 2, as shown in FIG. 18(*d*). Thus, the potential profile of the discharge space is stable and similar to that shown in FIG. 18(*a*) (the third electrode 3 is not present). Consequently, the discharge path 101 obtained is thick, and the largest discharge current flows.

Figure 19A:
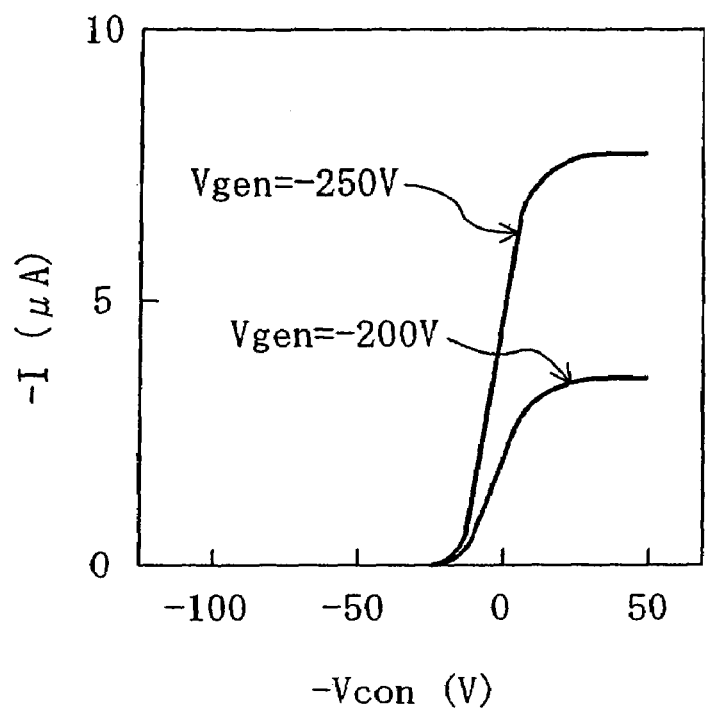
FIGS. 19(a) and 19(b) are graphs showing a variation in current I supplied to the switched section 4 of the switching element 100c of Embodiment 6 when one of a discharging voltage Vgen applied to the first electrode 1 and the discharge control voltage Vcon applied to the third electrode 3 is fixed with the other varied.
Figure 19B:
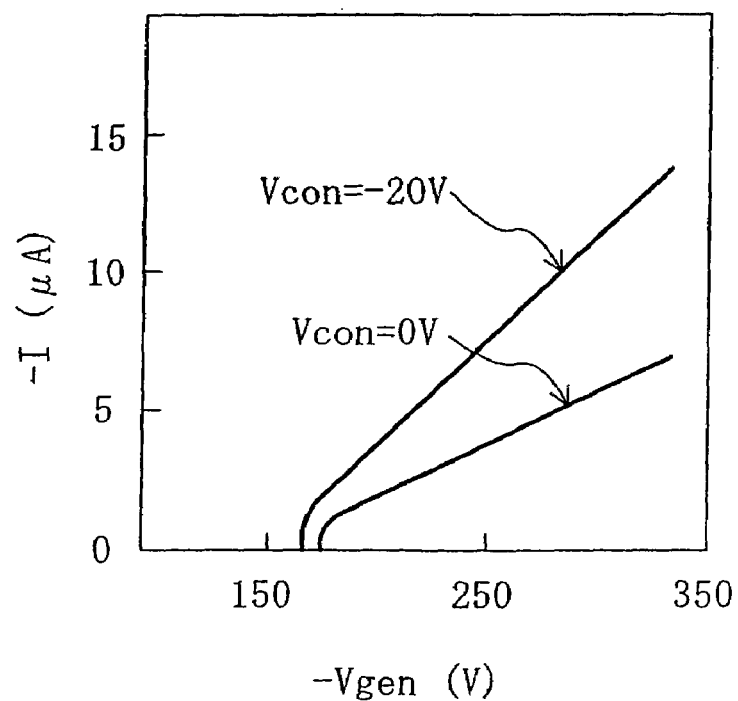
Figure 20:
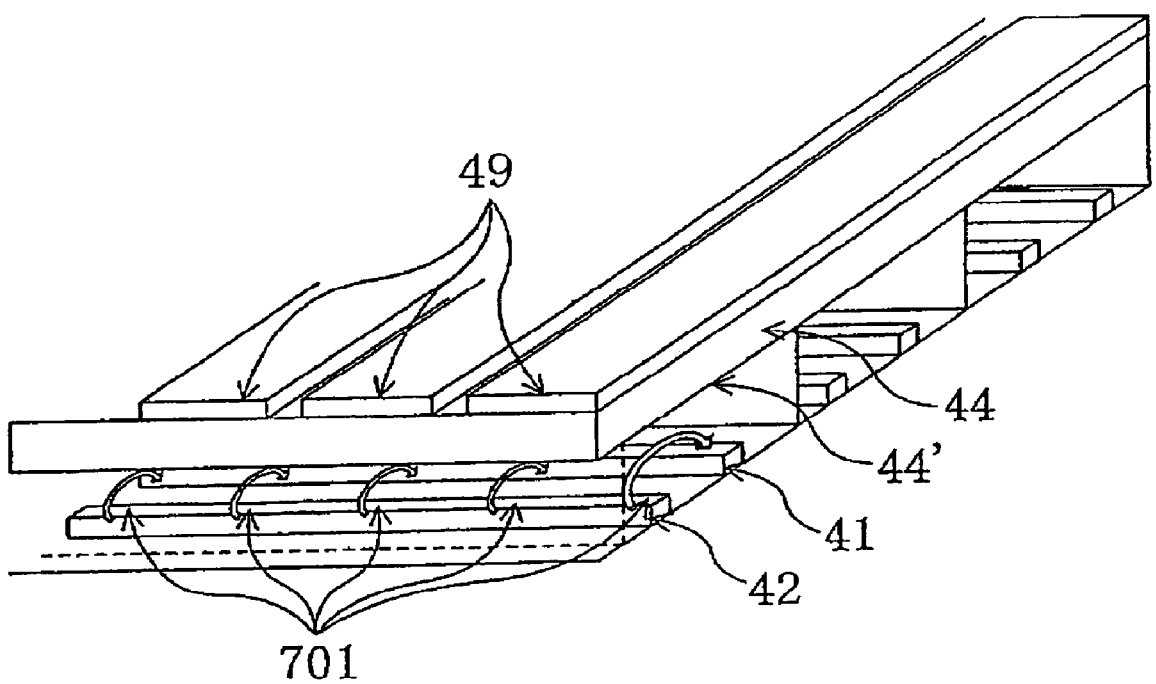
FIG. 20 is a perspective view schematically showing a conventional address device 700.

FIGS. 19(*a*) and 19(*b*) show the characteristics of the switching element 100*c* of the present embodiment. FIGS. 19(*a*) and 19(*b*) are graphs showing a variation in current I supplied to the switched section 4 when one of the discharging voltage Vgen applied to the first electrode 1 and the discharge control voltage Vcon applied to the third electrode 3 is fixed with the other varied.

As shown in FIGS. 19(*a*) and 19(*b*), the switching element 100*c* exhibits characteristics similar to those of the switching element 100 (FIG. 2) when the switching element 100*c* is driven while reducing the discharging voltage Vgen by about 50 V compared to the driving of the switching element 100. In this manner, the driving voltage for the switching element can be reduced by employing the arrangement in which the third electrode 3 is not located between the first electrode 1 and the second electrode 2.

The above arrangement is expected to reduce the voltage because when the third electrode 3 is provided so as not to lie between the first electrode 1 and the second electrode 2, the spacing between the first electrode 1 and the second electrode 2 can be reduced to allow discharge to occur with reduced voltages. To suitably achieve switching by controlling discharge, it is preferable to insulate the first and third electrodes 1 and 3 from each other and to create a certain spacing between the first electrode 1 and the second electrode 3. If the third electrode 3 is between the first electrode 1 and the second electrode 2, the spacing between the first electrode 1 and the second electrode 2 is necessarily larger than that between the first electrode 1 and the third electrode 3. In contrast, if the third electrode 3 is not located between the first electrode 1 and the second electrode 2, it is possible to reduce the spacing between the first electrode 1 and the second electrode 2 while creating a certain spacing between the first electrode 1 and the third electrode 3 to ensure the insulation between them.

When the third electrode 3 is provided so as not to lie between the first electrode 1 and the second electrode 2, it can be further separated from the first electrode 1. This suppresses and prevents the adhesion of a metal material to the third electrode 3, the material scattering from the first electrode 1 owing to a shock caused by positive ions present in the discharge space. Thus, the third electrode can be kept insulated for a long time, thus providing a reliable switching element exhibiting long-lived favorable characteristics.

For example, when the sizes of the electrodes and the intervals between them are similar to those of the switching element 100, although the insulation resistance between the first electrode 1 and the third electrode 3 becomes 1 MΩ about 15,000 hours after in the switching element 100 of Embodiment 1, that becomes 1 MΩ about 25,000 hours after in the switching element 100*c* of Embodiment 6.

The switching element according to the present invention is suitably used not only for the illustrated display device but also for various electronic devices having a switching function or an address function, for example, display devices such as organic EL display devices or liquid crystal display devices, address devices, semiconductor devices, and circuit boards.

According to the present invention, a switching element that is easy to manufacture is provided. The switching element according to the present invention can be suitably used for various electronic devices and particularly suitably for display devices. It is thus easy to increase the size of a display device while reducing its manufacturing costs.

The invention claimed is:

1. A display device comprising:
    a plurality of pixels arranged in a matrix;
    a switching element for supplying a current provided in each of the plurality of pixels, the switching element includes:

a discharge gas;
a first electrode and a second electrode that generate discharge between them; and
a third electrode that controls the discharge occurring between the first electrode and the second electrode; wherein
the third electrode is exposed to the discharge gas;
a scanning line electrically connected to one of the first and second electrodes of the switching element;
a signal line electrically connected to the third electrode of the switching element;
a pixel electrode electrically connected to the other of the first and second electrodes of the switching element;
a counter electrode opposed to the pixel electrode; and
a display medium layer provided between the pixel electrode and the counter electrode.

2. The display device according to claim 1, wherein the display medium layer is a liquid crystal layer.

3. The display device according to claim 1, wherein the display medium layer is an organic electro luminescence material layer.

4. A display device comprising:
a plurality of pixels arranged in a matrix;
a switching element for supplying a current provided in each of the plurality of pixels, the switching element includes:
a discharge gas;
a first electrode and a second electrode that generate discharge between them; and
a third electrode that controls the discharge occurring between the first electrode and the second electrode; wherein
the third electrode is exposed to the discharge gas;
a scanning line electrically connected to the third electrode of the switching element;
a signal line electrically connected to one of the first and second electrodes of the switching element;
a pixel electrode electrically connected to the other of the first and second electrodes of the switching element;
a counter electrode opposed to the pixel electrode; and
a display medium layer provided between the pixel electrode and the counter electrode.

5. The display device according to claim 4, wherein the display medium layer is a liquid crystal layer.

6. The display device according to claim 4, wherein the display medium layer is an organic electro luminescence material layer.

7. A display device comprising:
a plurality of pixels arranged in a matrix;
a switching element for supplying a current provided in each of the plurality of pixels, the switching element includes:
a discharge gas;
a first electrode and a second electrode provided apart from each other so as to run a discharge current between them; and
a third electrode configured to be capable of changing the difference in potential from at least one of the first and second electrodes, and of controlling the magnitude of the discharge current running between the first and second electrodes by changing the potential difference; wherein
the third electrode is exposed to the discharge gas;
a scanning line electrically connected to one of the first and second electrodes of the switching element;
a signal line electrically connected to the third electrode of the switching element;
a pixel electrode electrically connected to the other of the first and second electrodes of the switching element;
a counter electrode opposed to the pixel electrode; and
a display medium layer provided between the pixel electrode and the counter electrode.

8. The display device according to claim 7, wherein the display medium layer is a liquid crystal layer.

9. The display device according to claim 7, wherein the display medium layer is an organic electro luminescence material layer.

10. A display device comprising:
a plurality of pixels arranged in a matrix;
a switching element for supplying a current provided in each of the plurality of pixels, the switching element includes:
a discharge gas;
a first electrode and a second electrode provided apart from each other so as to run a discharge current between them; and
a third electrode configured to be capable of changing the difference in potential from at least one of the first and second electrodes, and of controlling the magnitude of the discharge current running between the first and second electrodes by changing the potential difference; wherein
the third electrode is exposed to the discharge gas;
a scanning line electrically connected to the third electrode of the switching element;
a signal line electrically connected to one of the first and second electrodes of the switching element;
a pixel electrode electrically connected to the other of the first and second electrodes of the switching element;
a counter electrode opposed to the pixel electrode; and
a display medium layer provided between the pixel electrode and the counter electrode.

11. The display device according to claim 10, wherein the display medium layer is a liquid crystal layer.

12. The display device according to claim 10, wherein the display medium layer is an organic electro luminescence material layer.

13. A display device comprising:
a plurality of pixels arranged in a matrix;
a switching element for supplying a current provided in each of the plurality of pixels, the switching element includes:
a discharge gas;
a first electrode and a second electrode provided apart from each other so as to run a discharge current between them; and
a third electrode configured to be capable of changing the difference in potential from at least one of the first and second electrodes, and of controlling the magnitude of a discharge current running between the first and second electrodes by changing the potential difference; wherein
a discharge gas is provided between the first electrode and the second electrode and between one of the first and second electrodes and the third electrode;
the pressure of the discharge gas is set so that a starting voltage of discharge between the one of the first and second electrodes and the third voltage is higher than that between the first electrode and the second electrode; and
the third electrode is exposed to the discharge gas;
a scanning line electrically connected to one of the first and second electrodes of the switching element;

a signal line electrically connected to the third electrode of the switching element;

a pixel electrode electrically connected to the other of the first and second electrodes of the switching element;

a counter electrode opposed to the pixel electrode; and a display medium layer provided between the pixel electrode and the counter electrode.

14. The display device according to claim 13, wherein the display medium layer is a liquid crystal layer.

15. The display device according to claim 13, wherein the display medium layer is an organic electro luminescence material layer.

16. A display device comprising:

a plurality of pixels arranged in a matrix;

a switching element for supplying a current each provided in each of the plurality of pixels, the switching element includes:

a discharge gas;

a first electrode and a second electrode provided apart from each other so as to run a discharge current between them; and a third electrode configured to be capable of changing the difference in potential from at least one of the first and second electrodes, and of controlling the magnitude of a discharge current running between the first and second electrodes by changing the potential difference; wherein a discharge gas is provided between the first electrode and the second electrode and between one of the first and second electrodes and the third electrode;

the pressure of the discharge gas is set so that a starting voltage of discharge between the one of the first and second electrodes and the third voltage is higher than that between the first electrode and the second electrode; and the third electrode is exposed to the discharge gas;

a scanning line electrically connected to the third electrode of the switching element;

a signal line electrically connected to one of the first and second electrodes of the switching element;

a pixel electrode electrically connected to the other of the first and second electrodes of the switching element;

a counter electrode opposed to the pixel electrode; and a display medium layer provided between the pixel electrode and the counter electrode.

17. The display device according to claim 16, wherein the display medium layer is a liquid crystal layer.

18. The display device according to claim 16, wherein the display medium layer is an organic electro luminescence material layer.

19. A display device comprising:

a plurality of pixels arranged in a matrix;

a switching element for supplying a current provided in each of the plurality of pixels, the switching element includes:

a discharge gas;

a first electrode and a second electrode provided apart from each other so as to run a discharge current between them; and a third electrode configured to be capable of changing the difference in potential from at least one of the first and second electrodes; wherein a discharge gas is provided between the first electrode and the second electrode and between one of the first and second electrodes and the third electrode;

the third electrode varies a distribution of equipotential surfaces attributed to discharge occurring between the first electrode and the second electrode; and the third electrode is exposed to the discharge gas;

a scanning line electrically connected to one of the first and second electrodes of the switching element;

a signal line electrically connected to the third electrode of the switching element;

a pixel electrode electrically connected to the other of the first and second electrodes of the switching element;

a counter electrode opposed to the pixel electrode; and a display medium layer provided between the pixel electrode and the counter electrode.

20. The display device according to claim 19, wherein the display medium layer is a liquid crystal layer.

21. The display device according to claim 19, wherein the display medium layer is an organic electro luminescence material layer.

22. A display device comprising:

a plurality of pixels arranged in a matrix;

a switching element for supplying a current provided in each of the plurality of pixels, the switching element includes:

a discharge gas;

a first electrode and a second electrode provided apart from each other so as to run a discharge current between them; and a third electrode configured to be capable of changing the difference in potential from at least one of the first and second electrodes; wherein a discharge gas is provided between the first electrode and the second electrode and between one of the first and second electrodes and the third electrode;

the third electrode varies a distribution of equipotential surfaces attributed to discharge occurring between the first electrode and the second electrode; and the third electrode is exposed to the discharge gas;

a scanning line electrically connected to the third electrode of the switching element;

a signal line electrically connected to one of the first and second electrodes of the switching element;

a pixel electrode electrically connected to the other of the first and second electrodes of the switching element;

a counter electrode opposed to the pixel electrode; and a display medium layer provided between the pixel electrode and the counter electrode.

23. The display device according to claim 22, wherein the display medium layer is a liquid crystal layer.

24. The display device according to claim 22, wherein the display medium layer is an organic electro luminescence material layer.

* * * * *